US011894436B2

(12) United States Patent
Frougier et al.

(10) Patent No.: US 11,894,436 B2
(45) Date of Patent: Feb. 6, 2024

(54) GATE-ALL-AROUND MONOLITHIC STACKED FIELD EFFECT TRANSISTORS HAVING MULTIPLE THRESHOLD VOLTAGES

(71) Applicant: International Business Machines Corporation, Armonk, NY (US)

(72) Inventors: Julien Frougier, Albany, NY (US); Ruilong Xie, Niskayuna, NY (US); Nicolas Loubet, Guilderland, NY (US); Andrew M. Greene, Slingerlands, NY (US); Veeraraghavan S. Basker, Schenectady, NY (US); Balasubramanian S. Pranatharthiharan, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 23 days.

(21) Appl. No.: 17/543,028

(22) Filed: Dec. 6, 2021

(65) Prior Publication Data

US 2023/0178620 A1    Jun. 8, 2023

(51) Int. Cl.
*H01L 29/423* (2006.01)
*H01L 29/06* (2006.01)
(Continued)

(52) U.S. Cl.
CPC .... *H01L 29/42392* (2013.01); *H01L 29/0673* (2013.01); *H01L 29/66545* (2013.01); *H01L 29/78696* (2013.01)

(58) Field of Classification Search
CPC .......... H01L 29/42392; H01L 29/0673; H01L 29/66545; H01L 29/78696; H01L 27/092
See application file for complete search history.

(56) References Cited

U.S. PATENT DOCUMENTS

| 8,674,470 B1 | 3/2014 | Or-Bach |
| 9,735,269 B1 | 8/2017 | Cheng |
| (Continued) | | |

FOREIGN PATENT DOCUMENTS

| CN | 113130489 A | 7/2021 |
| EP | 4092723 A1 | 11/2022 |

OTHER PUBLICATIONS

"PCT Notification of Transmittal of the International Search Report and the Written Opinion of the International Searching Authority, or the Declaration", International Application No. PCT/EP2022/083130, International fling date Nov. 24, 2022, dated Mar. 2, 2023, 17 Pgs.

(Continued)

*Primary Examiner* — Shih Tsun A Chou
(74) *Attorney, Agent, or Firm* — David K. Mattheis

(57) ABSTRACT

A CFET (complementary field effect transistor) structure including a substrate, a first CFET formed above the substrate, and a second CFET formed above the substrate. The first CFET includes a top FET and a bottom FET. The top FET and bottom FET of the first CFET include at least one nanosheet channel. A gate affiliated with the first CFET and the second CFET devices includes a continuous horizontal dielectric over the entire length of the gate. The top FET of each CFET has a first polarity. The bottom FET of each a CFET comprises a second polarity. The top FET of the first CFET includes a first work function metal, and the top FET of the second CFET includes a second work function metal.

14 Claims, 32 Drawing Sheets

(51) Int. Cl.
*H01L 29/66* (2006.01)
*H01L 29/786* (2006.01)

(56) References Cited

U.S. PATENT DOCUMENTS

| | | | |
|---|---|---|---|
| 9,837,491 B2 | 12/2017 | Rosenblatt | |
| 10,026,652 B2 | 7/2018 | Wang | |
| 10,192,819 B1 | 1/2019 | Chanemougame | |
| 10,192,867 B1 | 1/2019 | Frougier | |
| 10,319,846 B1 | 6/2019 | Ando | |
| 10,510,620 B1 | 12/2019 | Chanemougame | |
| 10,510,622 B1 | 12/2019 | Frougier | |
| 10,950,722 B2 | 3/2021 | Zhang | |
| 2018/0212034 A1 | 7/2018 | Chang | |
| 2018/0212035 A1 | 7/2018 | Cheng | |
| 2019/0172755 A1 | 6/2019 | Smith | |
| 2019/0172828 A1 | 6/2019 | Smith | |
| 2020/0098756 A1* | 3/2020 | Lilak | H01L 29/78696 |
| 2020/0266169 A1 | 8/2020 | Kang | |
| 2020/0266218 A1 | 8/2020 | Lilak | |
| 2020/0381430 A1 | 12/2020 | Liebmann | |
| 2021/0013111 A1 | 1/2021 | Smith | |
| 2021/0043630 A1* | 2/2021 | Liebmann | H01L 27/0688 |
| 2021/0104522 A1 | 4/2021 | Gardner | |
| 2021/0175128 A1 | 6/2021 | Gardner | |
| 2021/0202481 A1 | 7/2021 | Fulford | |
| 2022/0223610 A1* | 7/2022 | Chhabra | G11C 8/10 |
| 2023/0073078 A1* | 3/2023 | Rachmady | H01L 27/0688 |

OTHER PUBLICATIONS

J. Ryckaert et al., "The Complementary FET (CFET) for CMOS scaling beyond N3," Symposium on VLSI Technology, 2018, pp. 141-142.

List of IBM Patents or Patent Applications Treated as Related, filed herewith, pp. 1-2, Dec. 6, 2021.

U.S. Appl. No. 17/543,028, filed Dec. 6, 2021.

* cited by examiner

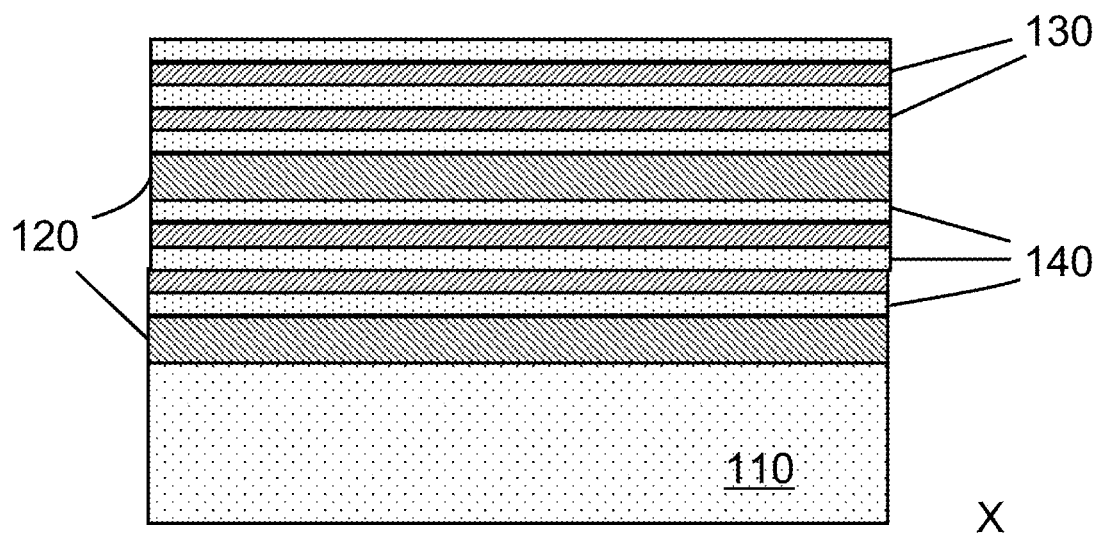
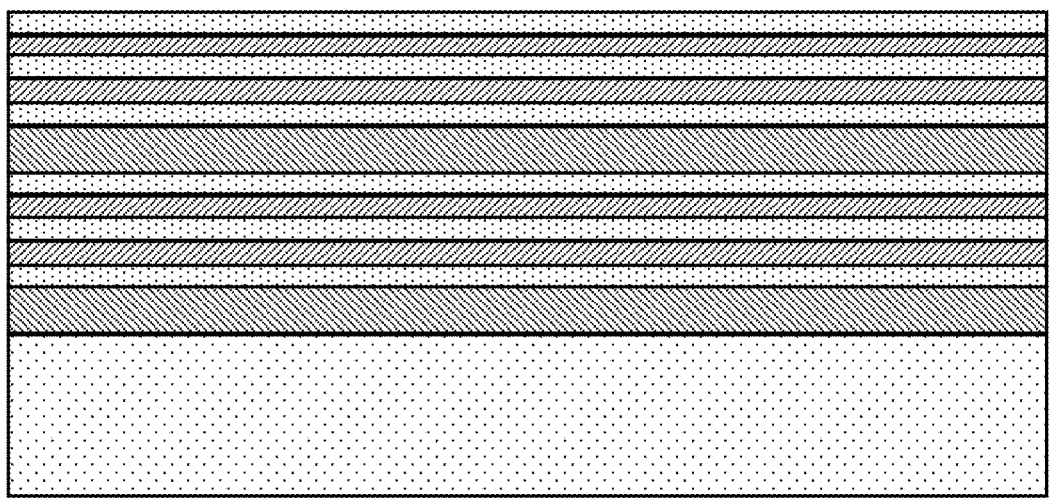
Fig. 1B

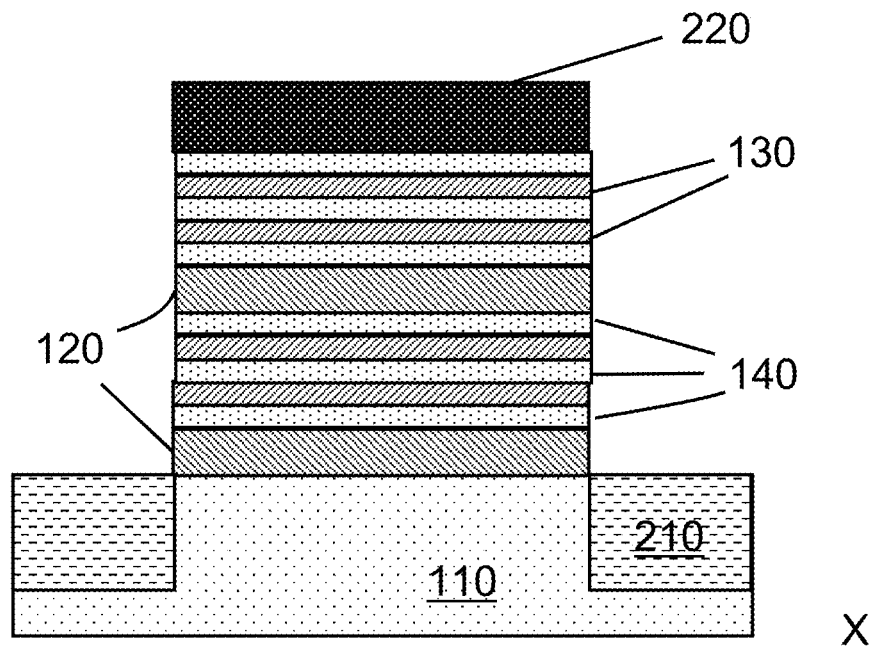
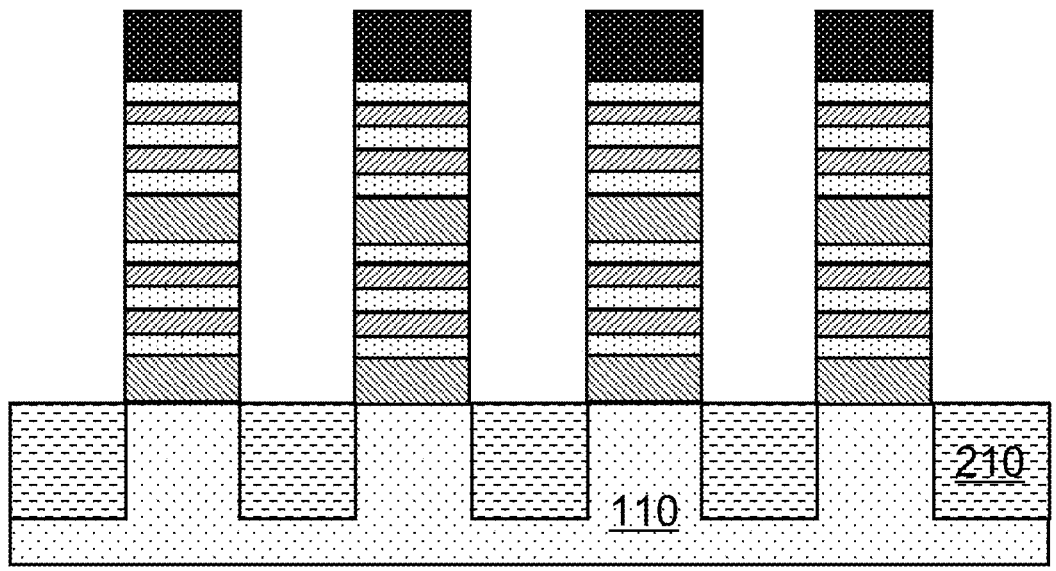
Fig. 2

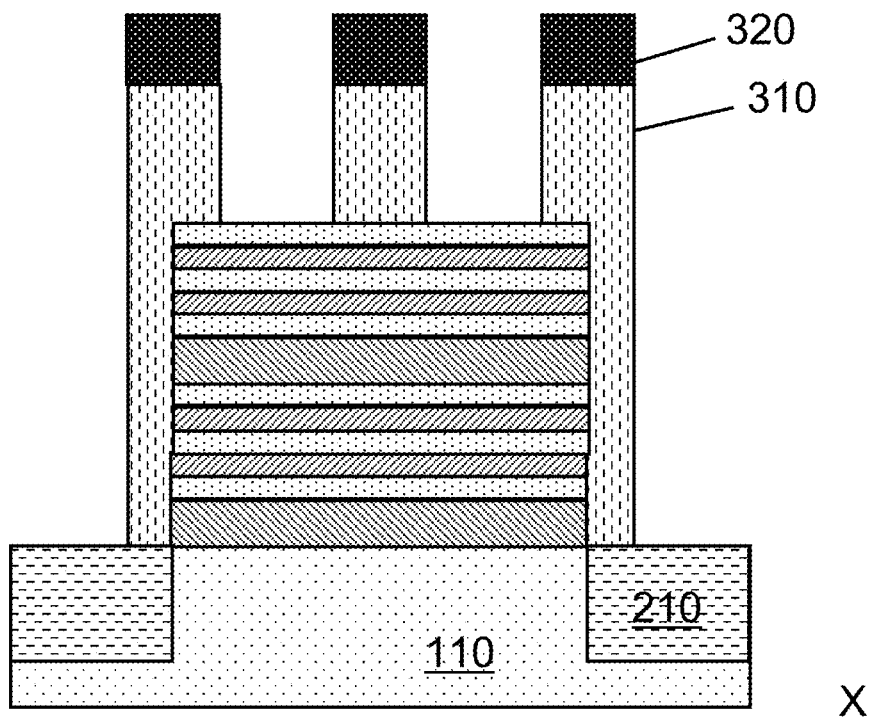
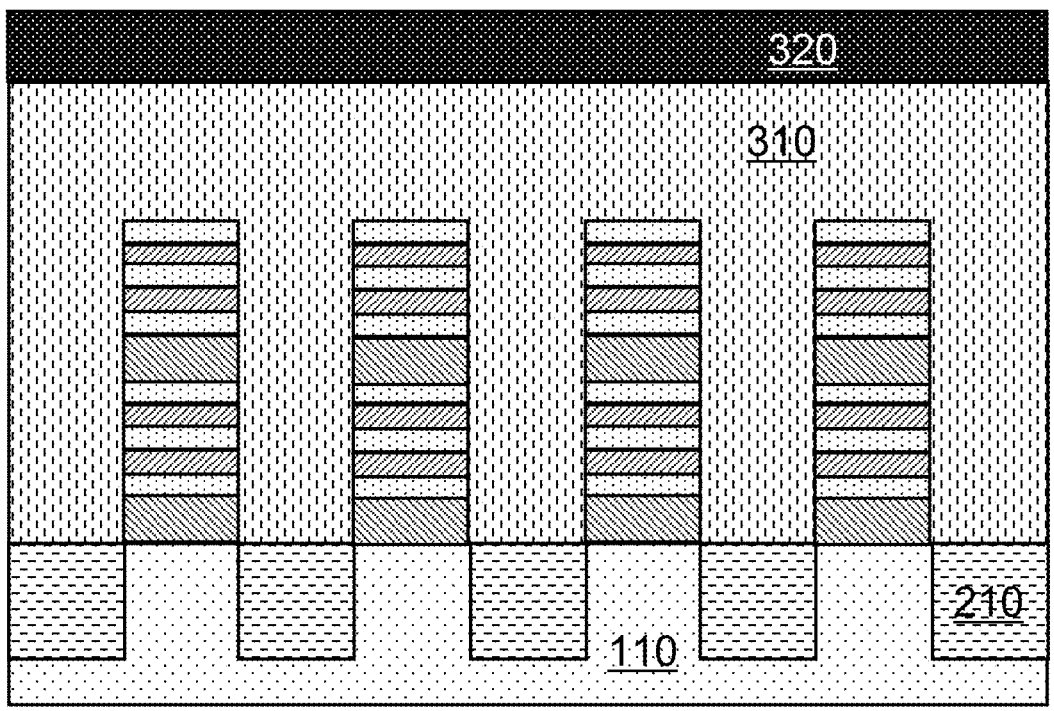
Fig. 3

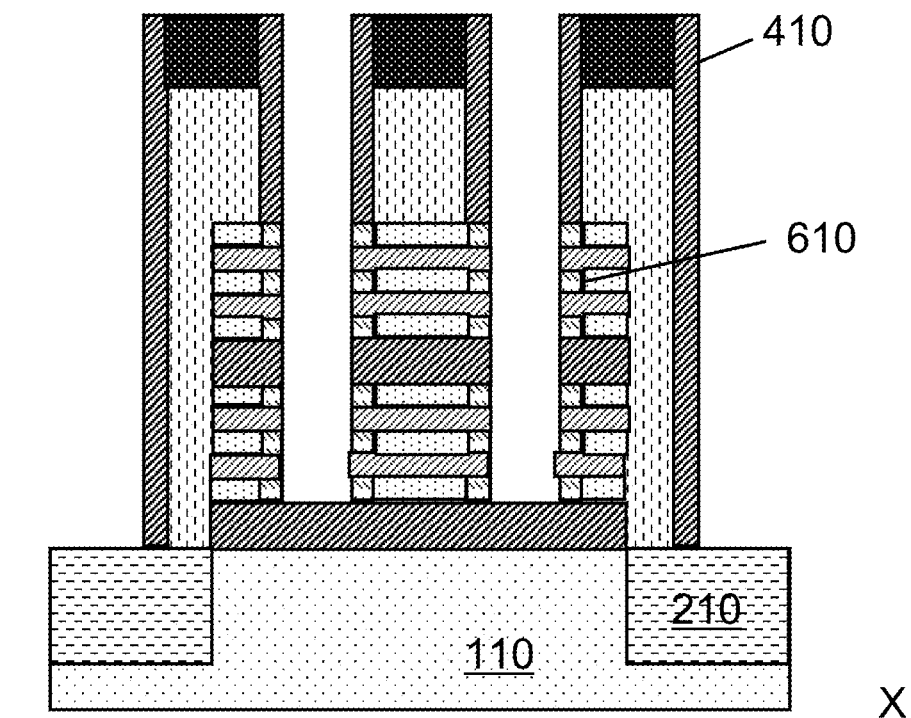
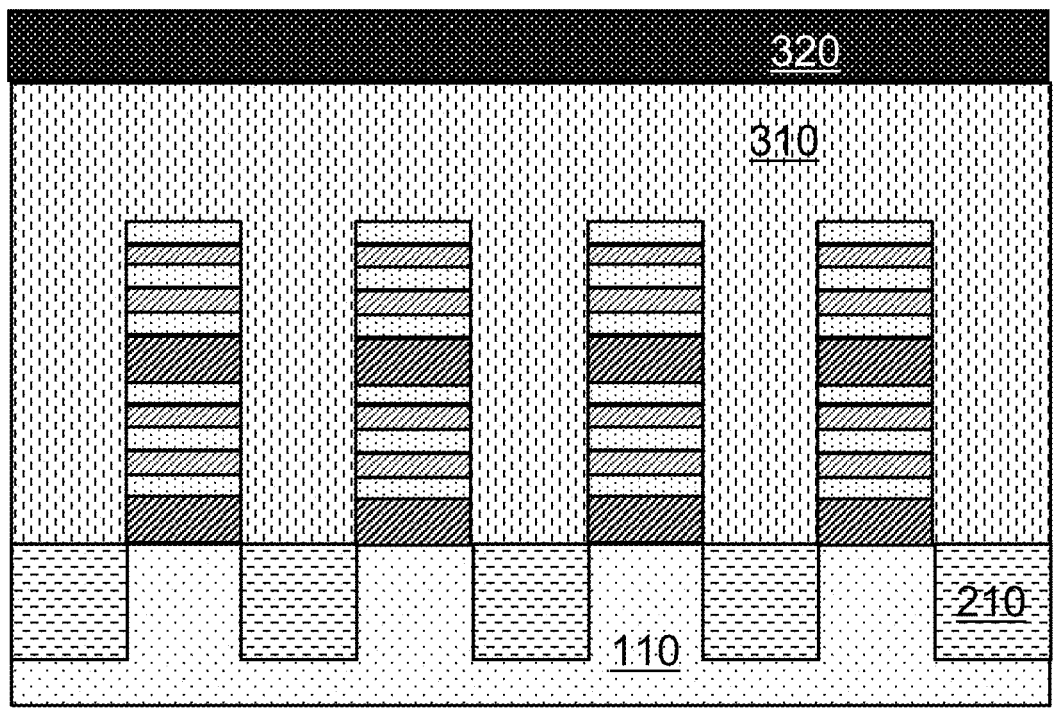
Fig. 6

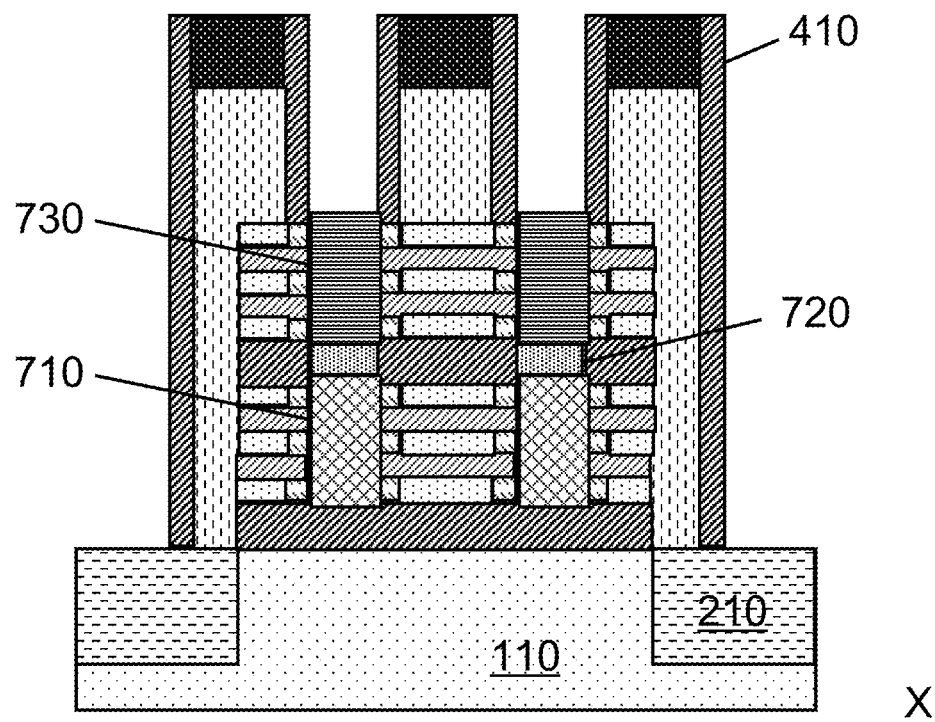
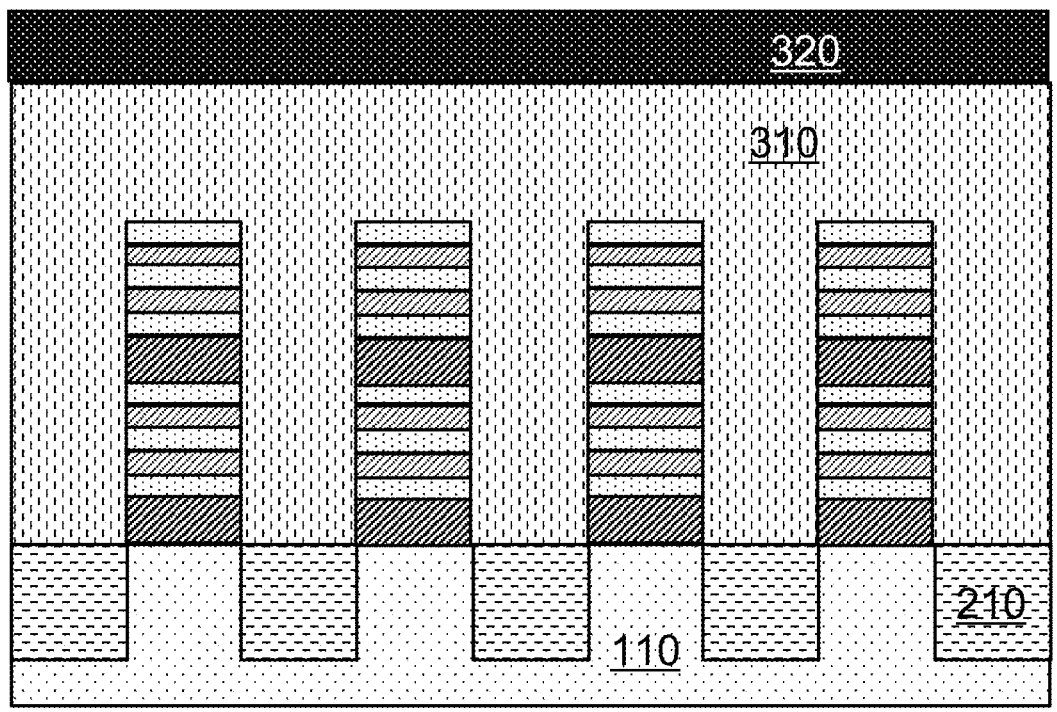
Fig. 7

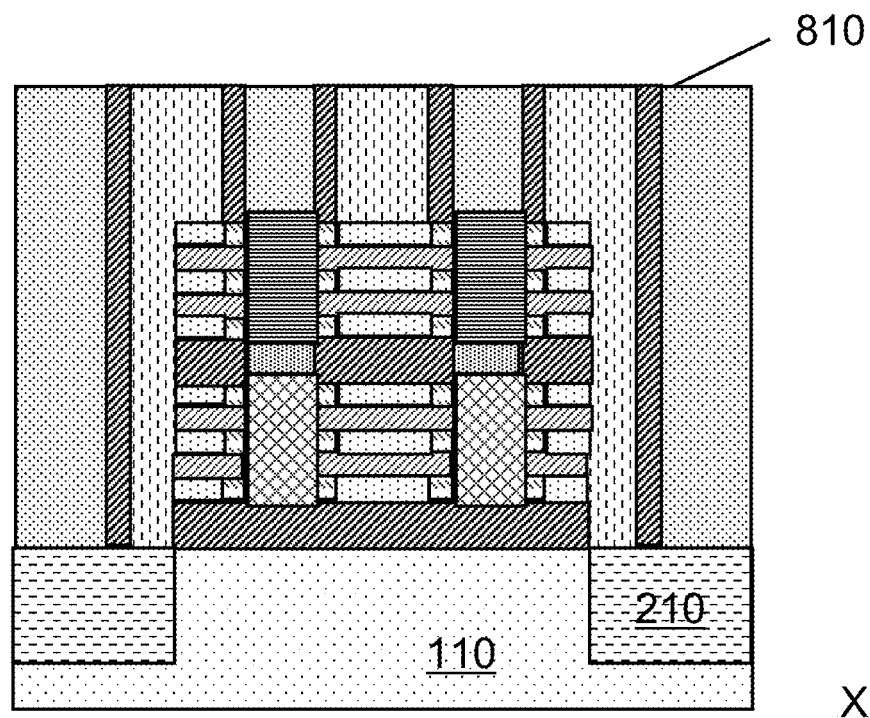
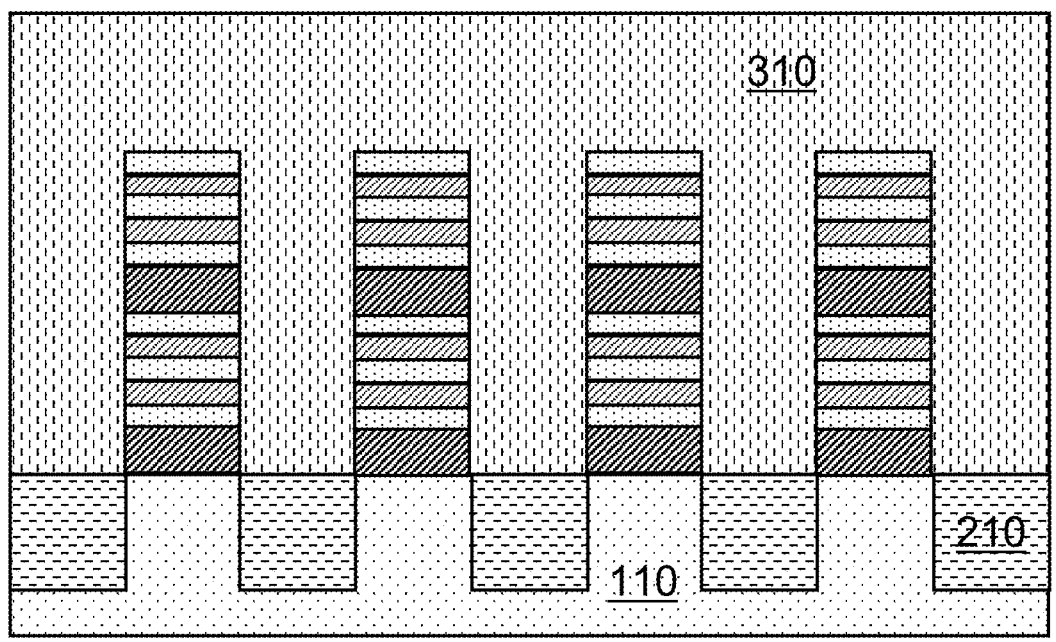
Fig. 8

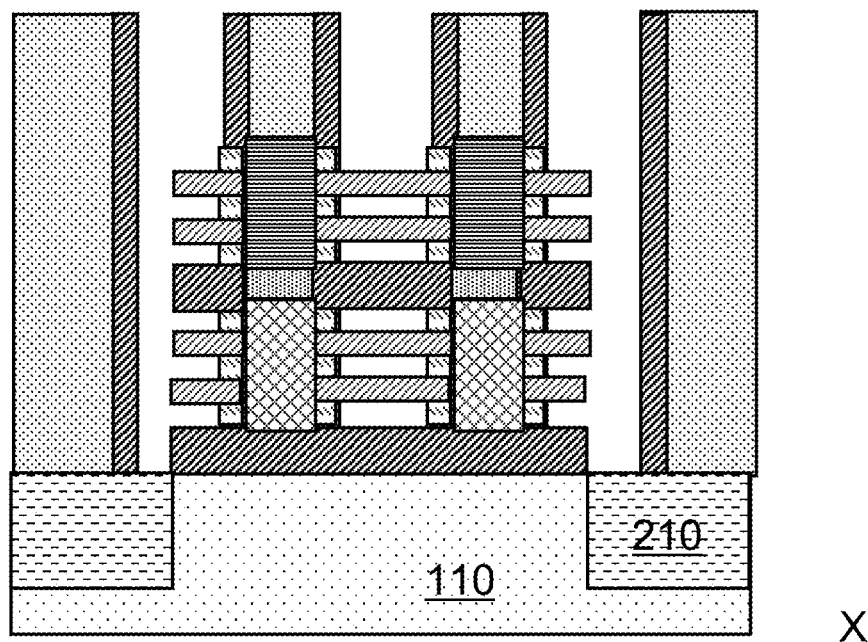
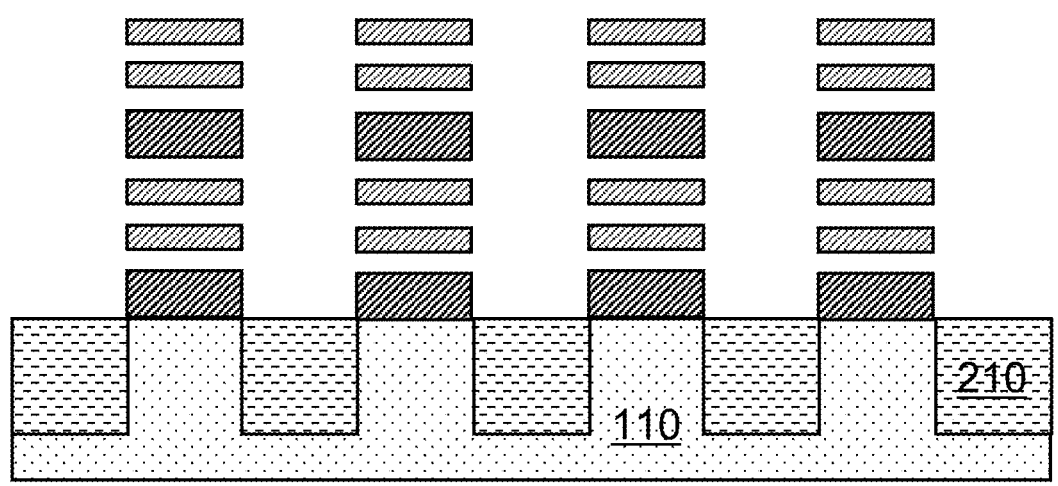
Fig. 9

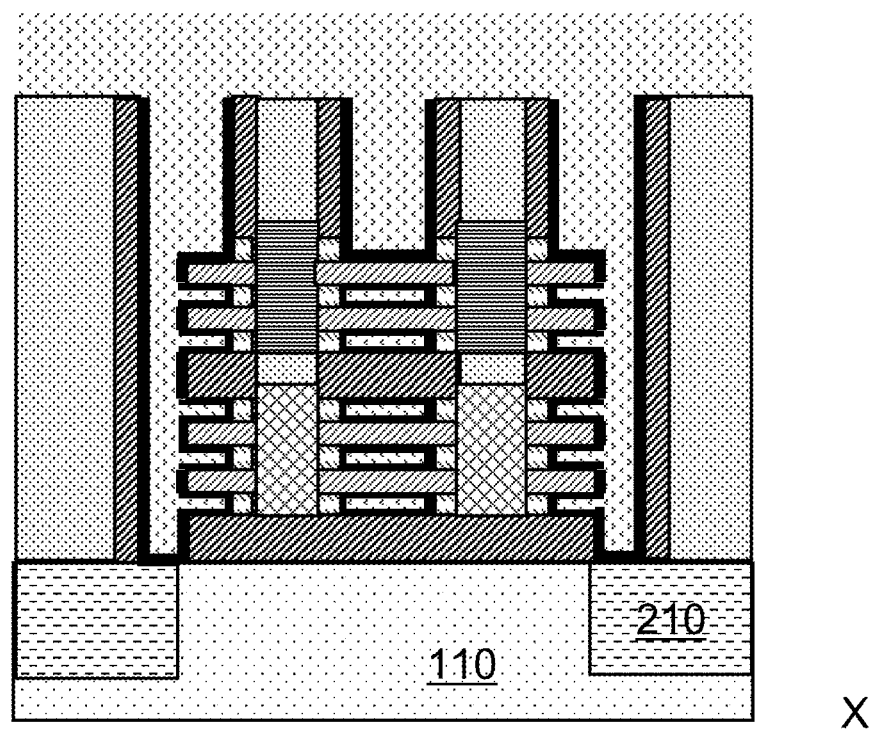
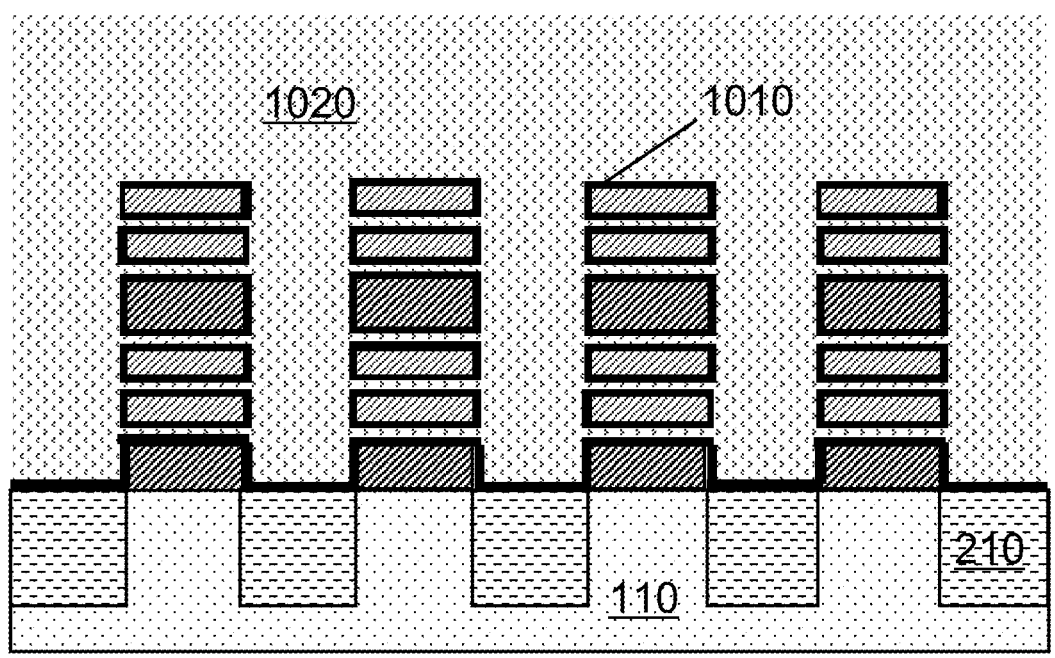
Fig. 10

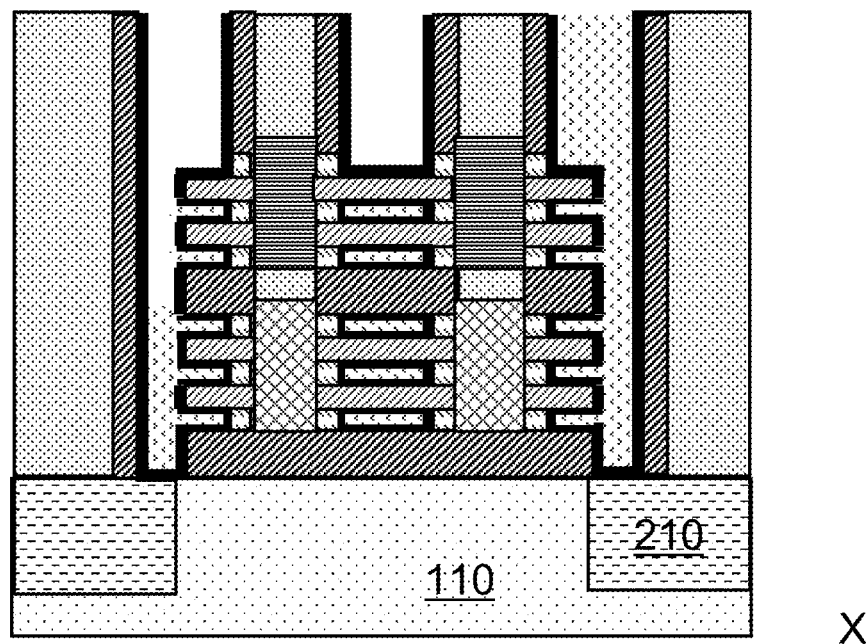
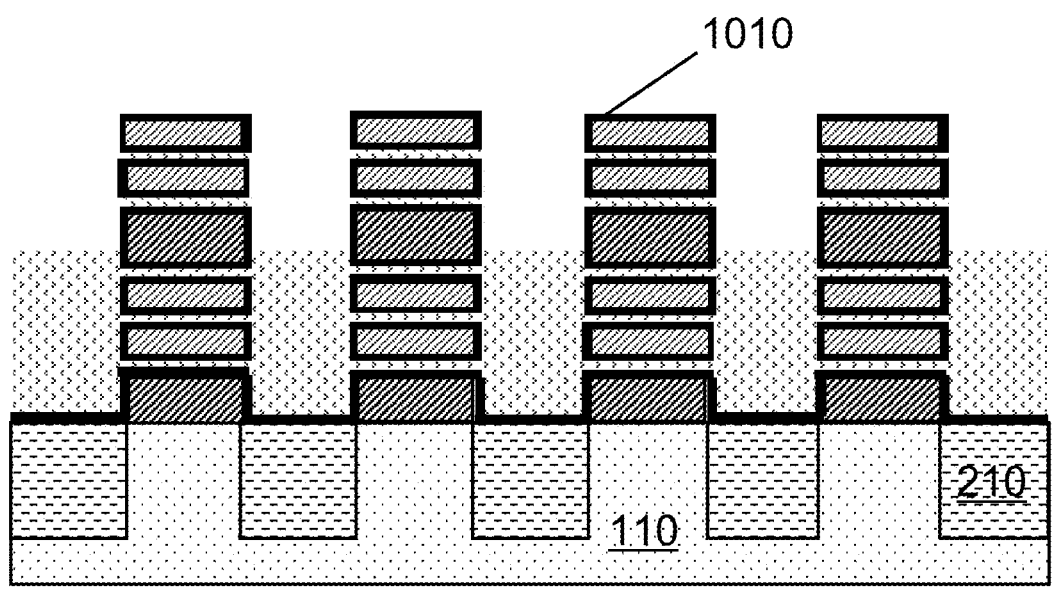
Fig. 11

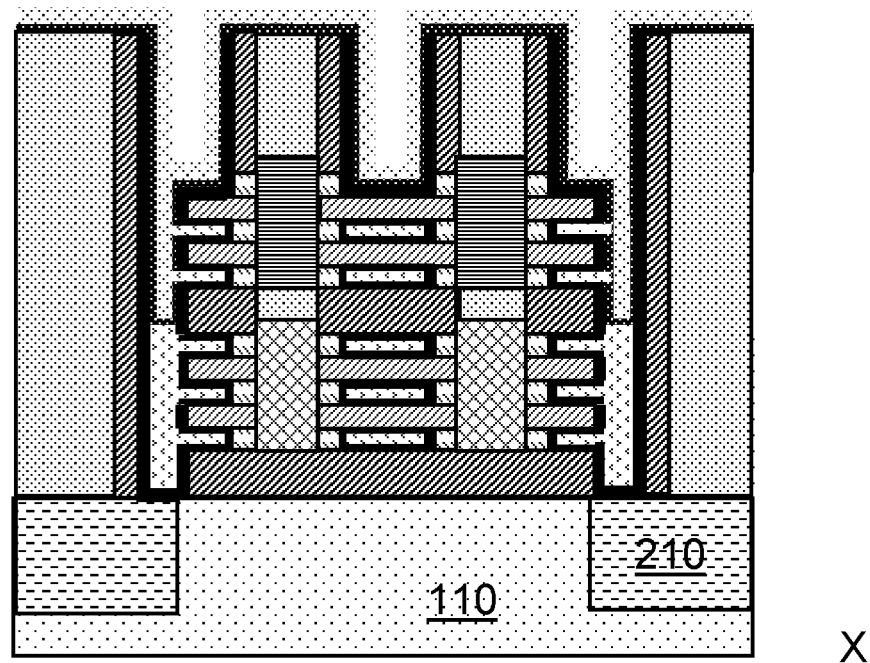
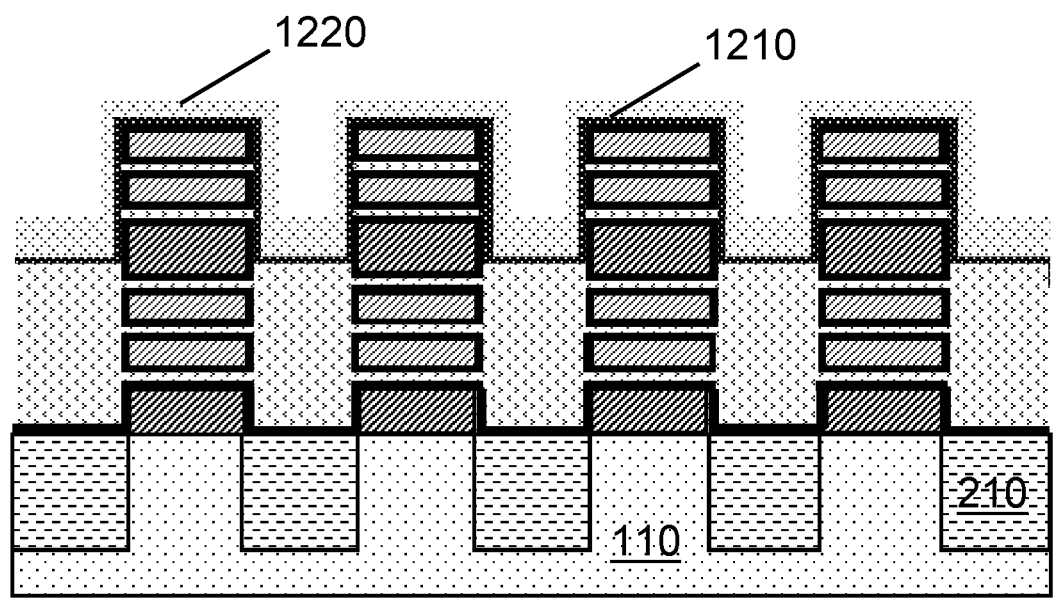
Fig. 12

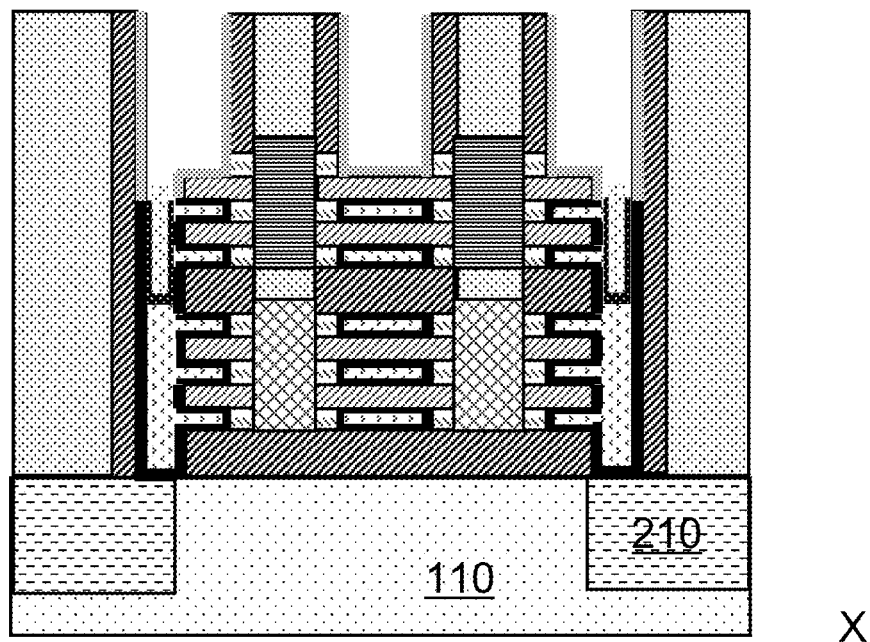
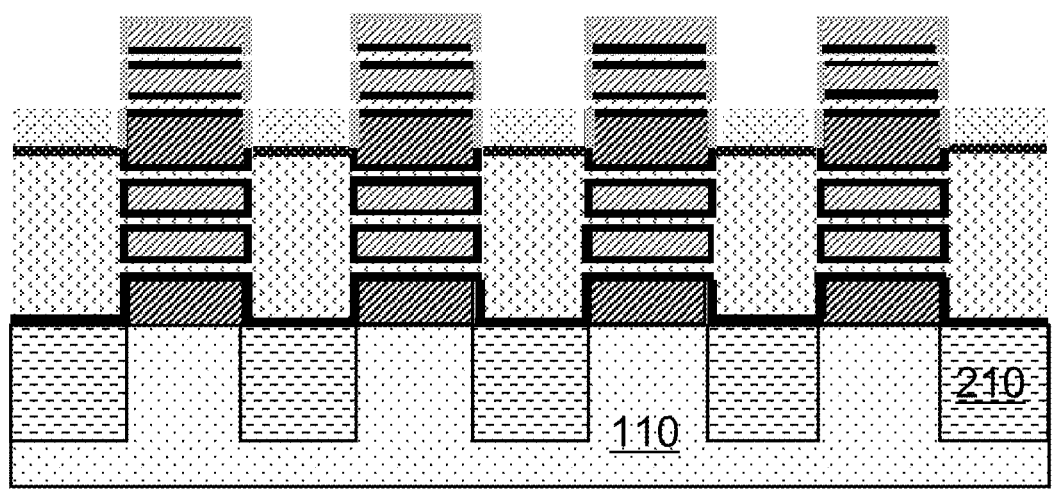
Fig. 13

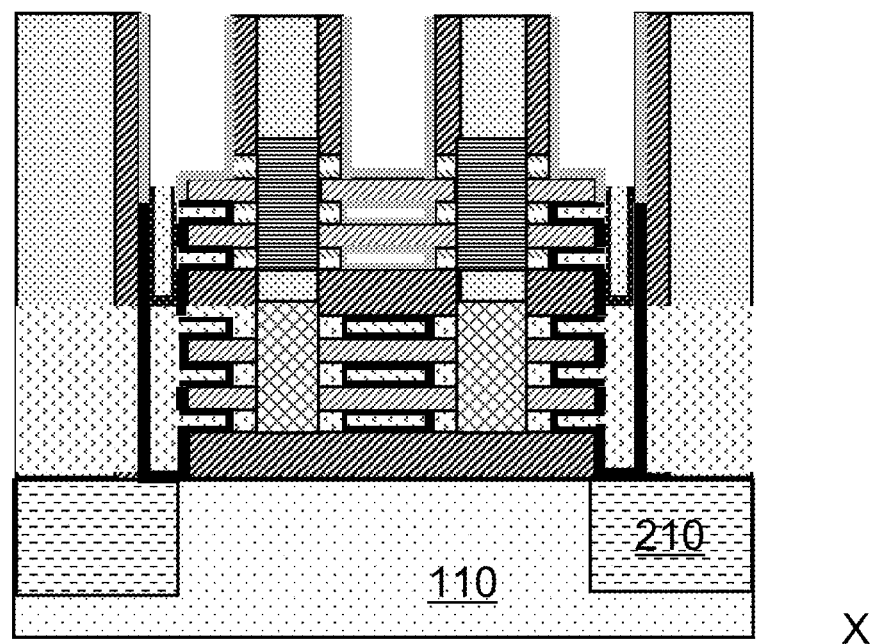
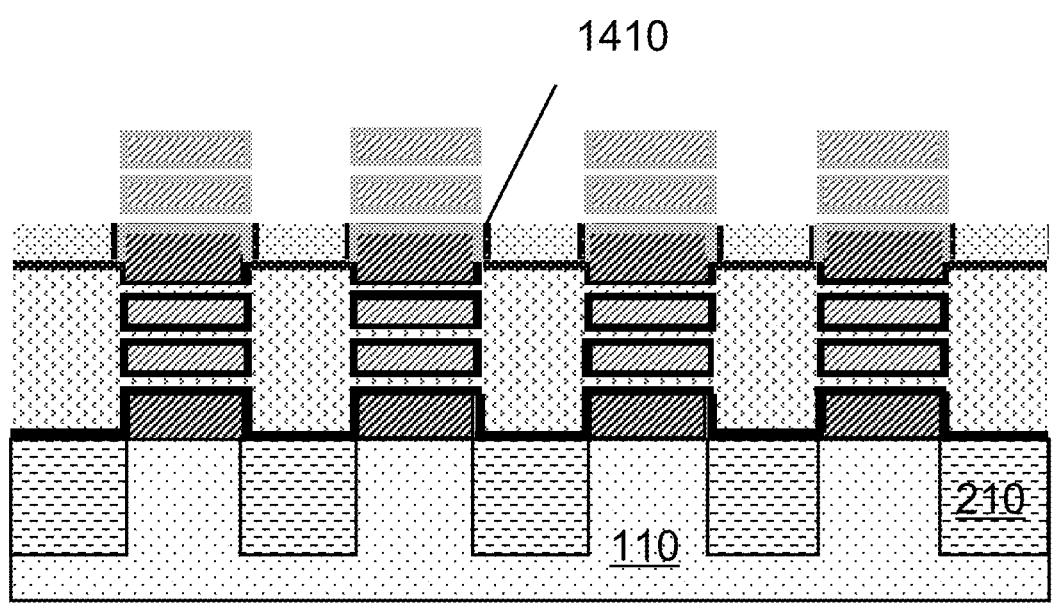
Fig. 15

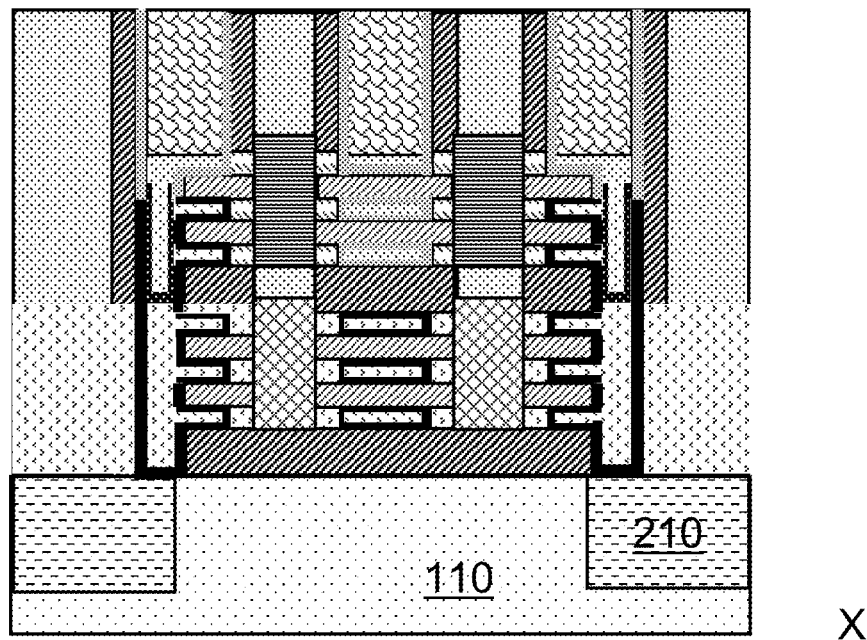
X
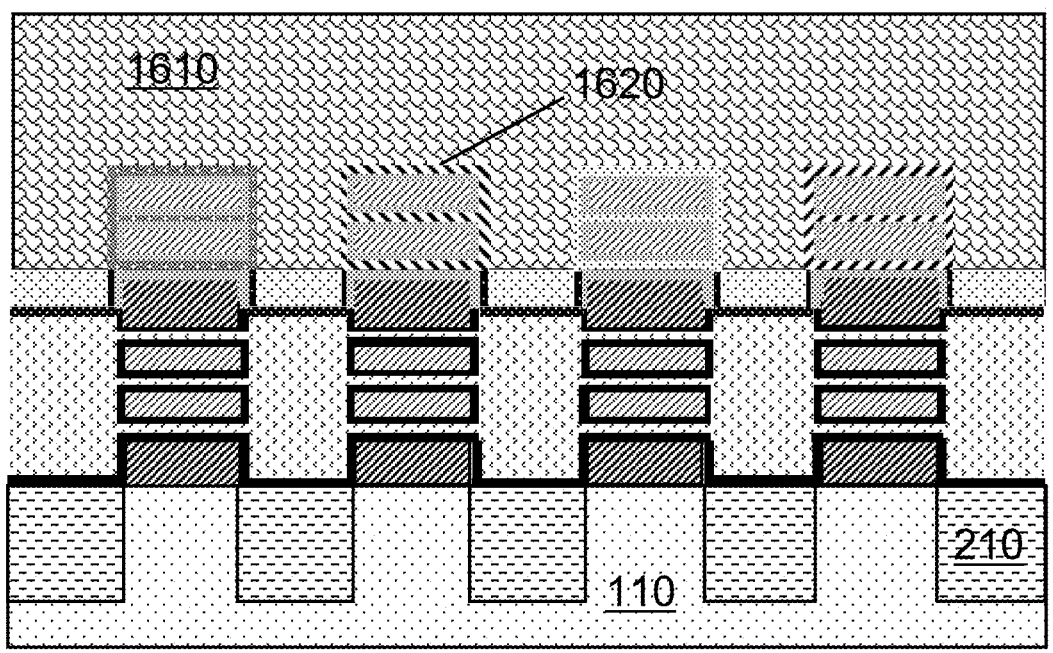
Fig. 16     Y

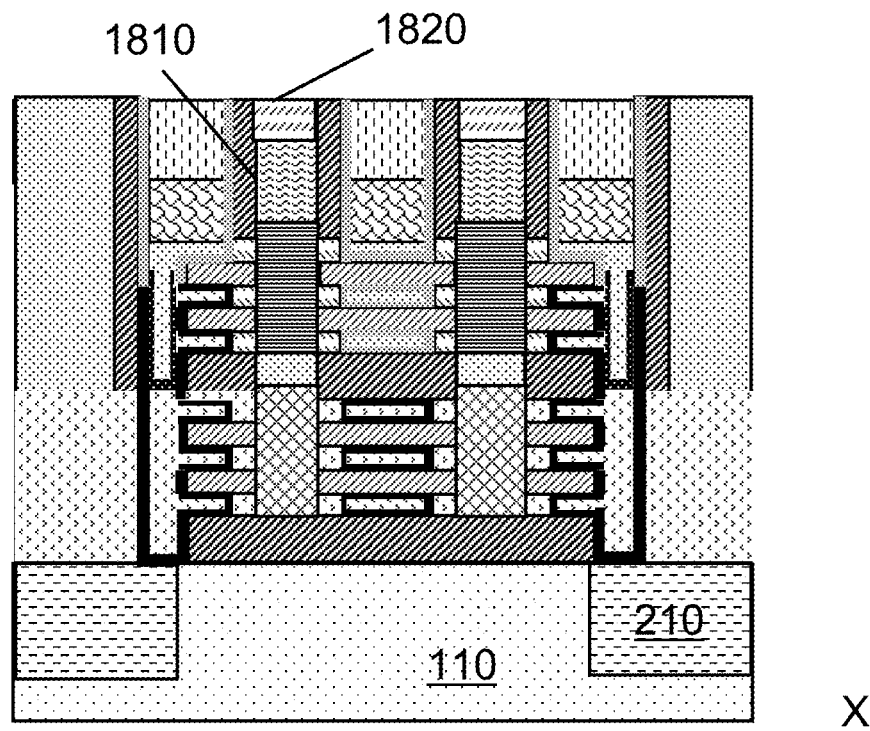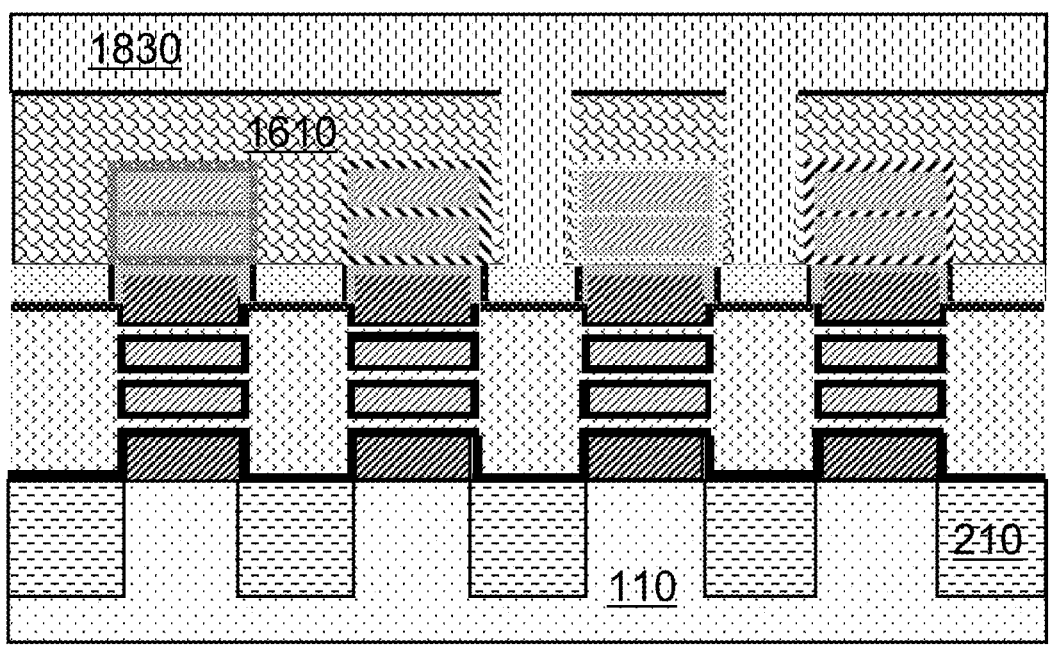
Fig. 18

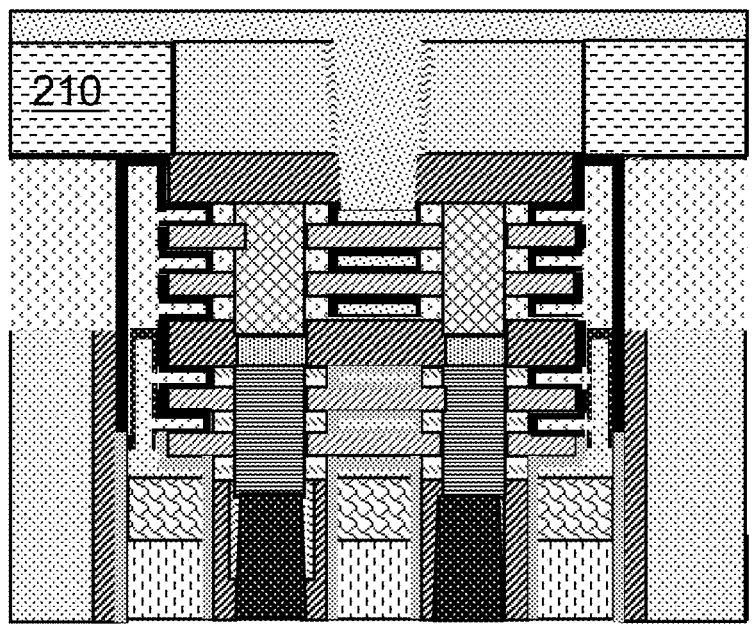
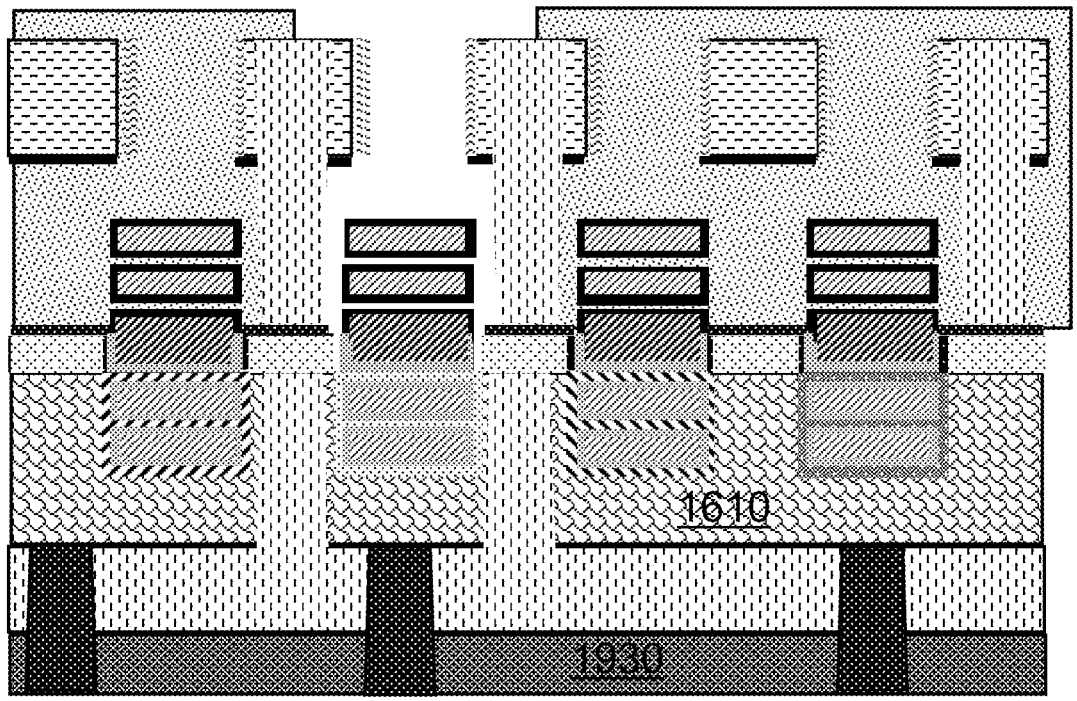
Fig. 25

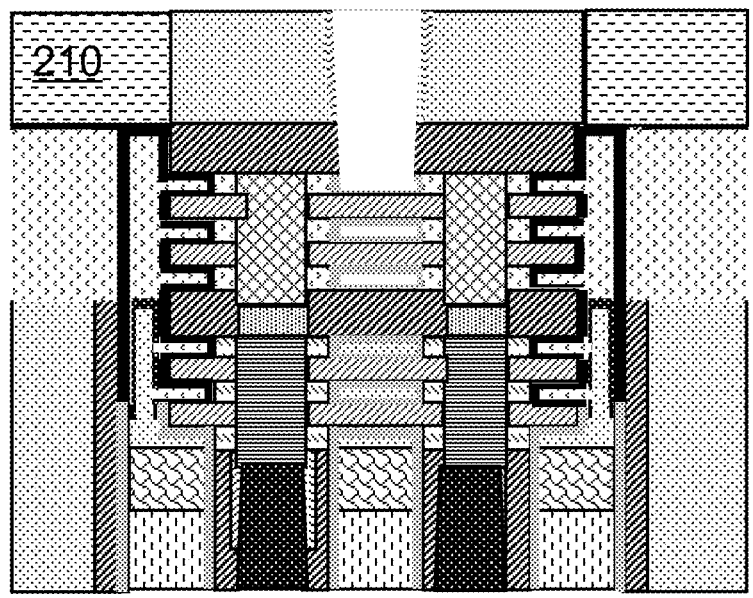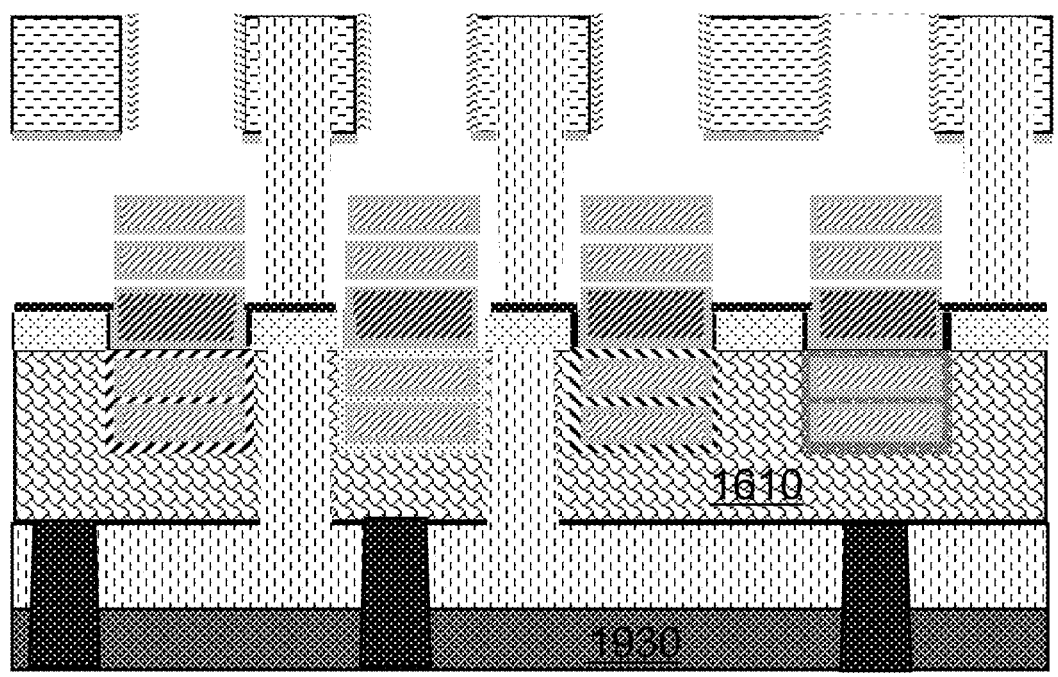
Fig. 26

GATE-ALL-AROUND MONOLITHIC STACKED FIELD EFFECT TRANSISTORS HAVING MULTIPLE THRESHOLD VOLTAGES

BACKGROUND

The disclosure relates generally to complementary field effect transistors (CFET) having multiple voltage thresholds. The disclosure relates particularly to gate-all-around CFET having multiple voltage thresholds.

Integrated circuit (IC) chips are formed on semiconductor wafers at increasingly smaller scale. In current technology nodes, transistor devices are constructed as three-dimensional (3D) field effect transistor (FET) structures. However, chipmakers face a myriad of challenges at 5 nm, 3 nm and beyond. Currently, chip scaling continues to slow as process complexities and costs escalate at each node.

Advanced gate-all-around technology includes complementary FET (CFET) where nFET and pFET nanowires/nanosheets are vertically stacked on top of each other. Multiple threshold voltage complementary metal-oxide semiconductor devices provide a way to optimize device performance in terms of switching delay and device power requirements.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

In one aspect a CFET structure (complementary field effect transistor) including a substrate, a first CFET formed above the substrate, and a second CFET formed above the substrate. The first CFET includes a top FET and a bottom FET. The top FET and bottom FET of the first CFET include at least one nanosheet channel. A gate affiliated with the first CFET and the second CFET devices includes a continuous horizontal dielectric over the entire length of the gate. The top FET of each CFET has a first polarity. The bottom FET of each a CFET comprises a second polarity. The top FET of the first CFET includes a first work function metal, and the top FET of the second CFET includes a second work function metal.

In one aspect, a CFET structure (complementary field effect transistor) includes a substrate, a first CFET formed above the substrate, a second CFET formed above the substrate, a third CFET formed above the substrate, and a fourth CFET formed above the substrate. The first CFET includes a top FET and a bottom FET, each of the top FET and bottom FET includes at least one nanosheet channel. A gate affiliated with the first CFET and the second CFET devices comprising a continuous horizontal dielectric over the entire length of the gate. The top FET of each CFET has a first polarity. The bottom FET of each a stacked FET has a second polarity. The top FET of the first CFET includes a first work function metal. The top FET of the second CFET includes a second work function metal, the top FET of the third CFET includes a third work function metal, and the top FET of the fourth CFET includes a fourth work function metal.

In one aspect, a method of fabricating a stacked field effect transistor (FET) semiconductor device includes disposing an interlayer high-k layer comprising a dielectric liner and amorphous silicon around nanosheet gate channels of a plurality of FET devices, forming a dielectric spacer between a top FET device and a bottom FET device, removing the amorphous silicon from the plurality of top FET devices, and disposing differing work function metals for each of a first top FET device and a second top FET device.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

FIG. 1B provides cross-sectional views of a step in the fabrication of a semiconductor device, according to an embodiment of the invention. The figure illustrates a formed and patterned stack of epitaxially grown nanosheet layers.

FIG. 2 provides cross-sectional views of a step in the fabrication of a semiconductor device, according to an embodiment of the invention. The figure illustrates the formation of device fins from the stack of nanosheet layers and the deposition of shallow trench isolation materials.

FIG. 3 provides cross-sectional views of a step in the fabrication of a semiconductor device, according to an embodiment of the invention. The figure illustrates dummy gate structures formed above the stack of nanosheet layers.

FIG. 6 provides cross-sectional views of a step in the fabrication of a semiconductor device, according to an embodiment of the invention. The figure illustrates the device after the selective removal of excess dielectric material from vertical surfaces and the formation of nanosheet inner spacers.

FIG. 7 provides cross-sectional views of a step in the fabrication of a semiconductor device, according to an embodiment of the invention. The figure illustrates the device after the epitaxial growth of upper and lower device source/drain regions.

FIG. 8 provides cross-sectional views of a step in the fabrication of a semiconductor device, according to an embodiment of the invention. The figure illustrates the device after the deposition of a protective sacrificial dielectric around the source/drain regions of the lower nanosheet device.

FIG. 9 provides cross-sectional views of a step in the fabrication of a semiconductor device, according to an embodiment of the invention. The figure illustrates the device after the removal of dummy gate materials.

FIG. 10 provides cross-sectional views of a step in the fabrication of a semiconductor device, according to an embodiment of the invention. The figure illustrates the device after deposition of a dielectric liner, mechanical protection liner, and place-holder spacing material around device nanosheet channels.

FIG. 11 provides cross-sectional views of a step in the fabrication of a semiconductor device, according to an embodiment of the invention. The figure illustrates the device after selective removal of the spacer material from around upper device nanosheet channels.

FIG. 12 provides cross-sectional views of a step in the fabrication of a semiconductor device, according to an embodiment of the invention. The figure illustrates the device after the deposition of a protective liner and flowable dielectric between the upper and lower FET device nanosheet stacks.

FIG. 13 provides cross-sectional views of a step in the fabrication of a semiconductor device, according to an embodiment of the invention. The figure illustrates the device after the selective removal of protective mechanical liner portions from exposed upper device surfaces.

FIG. 15 provides cross sectional views of a step in the fabrication of a semiconductor device, according to an embodiment of the invention. The figure illustrates the device after release of spacer material from between upper device nanosheet channels and the selective etching to remove the protective liner from between the nanosheet channels.

FIG. 16 provides cross-sectional views of a step in the fabrication of a semiconductor device, according to an embodiment of the invention. The figure illustrates the device after formation of upper FET device work function metal portions and a common upper FET high-k metal gate.

FIG. 18 provides cross-sectional views of a step in the fabrication of a semiconductor device, according to an embodiment of the invention. The figure illustrates the device after the formation of trench filling sacrificial caps and the formation of upper device source/drain contacts.

FIG. 25 provides cross-sectional views of a step in the fabrication of a semiconductor device, according to an embodiment of the invention. The figure illustrates the device after the selective etching of inter-device dielectric spacers to expose the work function metal of an upper FET device.

FIG. 26 provides cross-sectional views of a step in the fabrication of a semiconductor device, according to an embodiment of the invention. The figure illustrates the device after the ashing of OPL material, exposing the nanosheet channels for the four bottom FET devices.

DETAILED DESCRIPTION

Figure 1A:
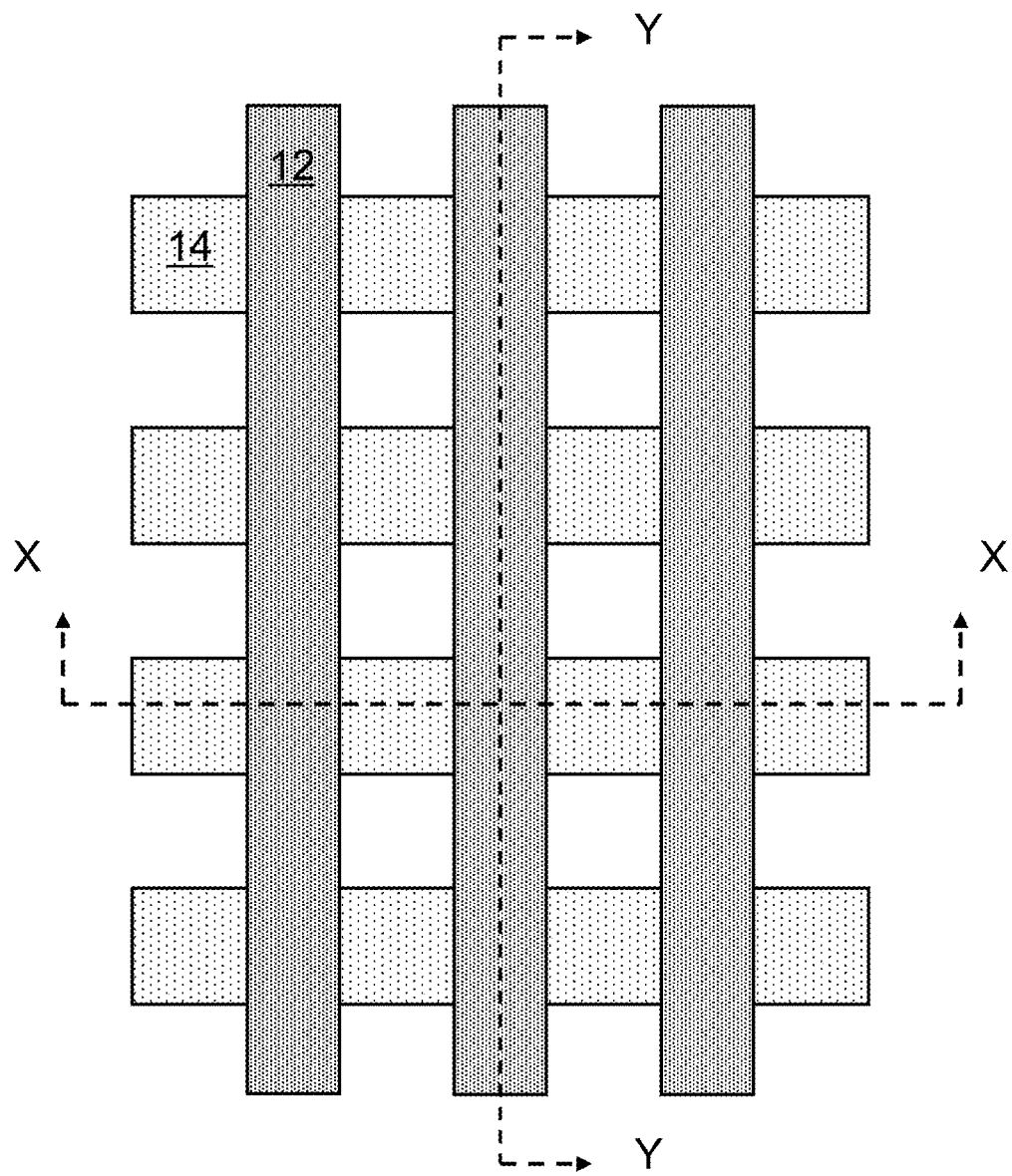
FIG. 1A provides a schematic plan view of device, according to an embodiment of the invention. The figure illustrates the location of the section lines associated with the respective views of FIGS. 1B-30.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials, process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried power rail interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Deposition processes for the metal liners and sacrificial materials include, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

One of the processing complexities of CFETs that needs to be addressed at nodes beyond 5 nm is providing device having multiple threshold voltages for the respective n-type FETs and respective p-type FETs of the device. Disclosed structures and associated fabrication methods provide devices having multiple voltage thresholds for the respective upper FETs of the CFETs as well as multiple voltage thresholds for the lower FETs of the CFETs. Disclosed embodiments include upper FET devices isolated from lower FET devices by a dielectric layer. In an embodiment, the dielectric isolation layer between upper FET and lower FET devices includes a composite dielectric layer. Disclosed embodiments include a variety of FET gate contacts, including gate contacts shared between upper or lower FETs, independent upper and lower device contacts, and stacked upper and lower devices having electrically connected gate work function metal portions. Disclosed embodiments are described through examples embodying nanosheet field effect transistors. The invention should not be considered limited in any manner to the nanosheet structures of the examples.

Reference is now made to the figures. The figures provide schematic cross-sectional illustration of semiconductor devices at intermediate stages of fabrication, according to one or more embodiments of the invention. The figures provide a front cross-section (X) parallel to the nanosheet fins of the device, and side cross-section (Y), parallel to the gate structures of the device. The figures provide schematic representations of the devices of the invention and are not to be considered accurate or limiting with regards to device element scale.

FIG. 1A provides a schematic plan view of a device, according to an embodiment of the invention. As shown in the Figure, gate structures 12, are disposed perpendicular to nanosheet stack fins 14. Section lines X and Y indicate the viewpoints of the respective views of FIGS. 1B-30.

FIG. 1B provides a schematic view of the device according to an embodiment of the invention following the deposition, patterning, and selective removal of material leaving a stack of layers for the formation of nanosheet CFET devices. In an embodiment, the stack includes alternating layers of epitaxially grown silicon germanium (SiGe) 140, 120, and silicon 130, disposed upon underlying substrate 110. Other materials having similar properties may be used in place of the SiGe and Si.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

The nanosheet stack includes a bottom-most layer of a first semiconductor material, such as SiGe and a top-most layer of a second semiconductor material, such as SiGe having a different (lower) Ge concentration. The nanosheet stack is depicted with twelve layers (three SiGe layers 140 and two Si layers 130 forming a lower device, three SiGe layers 140 and two Si layers 130 forming an upper device, a high Ge concertation, e.g., 50%-70% Ge, SiGe layer 120, separating the upper and lower devices and a high Ge concertation, e.g., 50%-70% Ge, SiGe layer 120, separating the stack from substrate 110), however any number and combinations of layers can be used so long as the layers alternate between SiGe and Si to form lower and upper devices and include a high Ge concentration SiGe layer separating the lower and upper devices from each other and from the underlying substrate. The nanosheet stack is depicted with the layers being in the form of nanosheets, however the width of any given nanosheet layer can be varied so as to result in the form of a nanowire, a nanoellipse, a nanorod, etc. SiGe layers 140, 120, can be composed of, for instance, $SiGe_{20-60}$, examples thereof including, but not limited to $SiGe_{20}$, $SiGe_{25}$, $SiGe_{30}$ . . . $SiGe_{65}$.

Substrate 110 can be composed of any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). An insulating layer 120 may be present on substrate 110 and, if present, is located between substrate 110 and the nanosheet stack. Insulating layer 120 can be, for example, a buried oxide layer (typically $SiO_2$) or a bottom dielectric isolation layer formed early in the process (typically SiN, SiBCN, SiOCN, SiOC, or any combination of low-k materials). In an embodiment, the insulating layer 120 further comprises one or more buried power rails (not shown) or other contacts associated with device elements formed in lower layers of the device.

In an embodiment, each sacrificial semiconductor material layer 140 and 120, is composed of a first semiconductor material which differs in composition from at least an upper portion of the semiconductor substrate 110. In one embodiment, the upper portion of the semiconductor substrate 110 is composed of silicon, while each sacrificial semiconductor material layers 140 and 120 is composed of a silicon germanium alloy. In such an embodiment, the SiGe alloy that provides each sacrificial semiconductor material layer 120 has a germanium content that is greater than 50 atomic percent germanium. In one example, the SiGe alloy that provides each sacrificial semiconductor material layer 120 has a germanium content from 50 atomic percent germanium to 70 atomic percent germanium. In such an embodiment, the SiGe alloy that provides each sacrificial semiconductor material layer 140 has a germanium content that is less than 50 atomic percent germanium. In one example, the SiGe alloy that provides each sacrificial semiconductor material layer 140 has a germanium content from 20 atomic percent germanium to 40 atomic percent germanium. The first semiconductor material that provides each sacrificial semiconductor material layers 140 and 120 can be formed utilizing an epitaxial growth (or deposition process).

Each semiconductor channel material layer 130, is composed of a second semiconductor material that has a different etch rate than the first semiconductor material of the sacrificial semiconductor material layers 140 and 120 and is also resistant to Ge condensation. The second semiconductor material of each semiconductor channel material layer 130, may be the same as, or different from, the semiconductor material of at least the upper portion of the semiconductor substrate 110. The second semiconductor material can be a SiGe alloy provided that the SiGe alloy has a germanium content that is less than 50 atomic percent germanium, and that the first semiconductor material is different from the second semiconductor material.

In one example, at least the upper portion of the semiconductor substrate 110 and each semiconductor channel material layer 130 is composed of Si or a III-V compound semiconductor, while each sacrificial semiconductor material layer 140, 120 is composed of a silicon germanium alloy. The second semiconductor material of each semiconductor channel material layer 130, can be formed utilizing an epitaxial growth (or deposition process).

Following deposition of the stack of layers 130, 140, and 120, across the surface of the device die, the layers are patterned using a process such as lithographic masking, and selectively etched, yielding a pattern of device fins including stacks of upper and lower device nanosheets separated by sacrificial layers of semiconductor materials. Such stacks define the active regions of the devices.

As shown in FIG. 2, fabrication of the device proceeds with the deposition of protective hard mask 220, followed by patterning, masking and selective etching of the hard mask 220 and stack of nanosheet layers to form individual nanosheet fin stacks. In an embodiment, hard mask 220 includes a nitride, oxide, an oxide-nitride bilayer, or another suitable material. In some embodiments, the hardmask 220 may include an oxide such as silicon oxide (SiO), a nitride such as silicon nitride (SiN), an oxynitride such as silicon oxynitride (SiON), combinations thereof, etc. In some embodiments, the hardmask 220 is a silicon nitride such as $Si_3N_4$.

In an embodiment, the etching proceeds into substrate 110. Deposition of a shallow trench isolation (STI) material 210, such as silicon dioxide, or any suitable combination of multiple dielectric materials (e.g., silicon nitride and silicon oxide), occurs after the formation of shallow trench isolation (STI) regions between nanosheet stack circuit elements of the device. Following such deposition, chemical mechanical planarization (CMP) processes smooth the upper surface of the deposited oxide in preparation for the subsequent fabrication steps. An oxide recess process trims the upper surface of STI regions to the level of the bottom sacrificial semiconductor layer 120. STI regions 210 provide electrical isolation between adjacent NS transistors.

FIG. 3 illustrates the device following the forming at least one dummy gate structure on the nanosheet stack. Three dummy gates are shown in the Figure, however any number of gates can be formed. Dummy gate structures can be formed by depositing a dummy gate material 310 over the nanosheet stack. The dummy gate material can be, for example, a thin layer of oxide, followed by polycrystalline silicon, amorphous silicon or microcrystal silicon. After that, a hardmask layer 320 is deposited over the dummy gate, followed by lithographic patterning, masking, and etching processes yielding the dummy gate structures of the Figure.

In an embodiment, hardmask 320 includes a nitride, oxide, an oxide-nitride bilayer, or another suitable material. In some embodiments, the hardmask 320 may include an oxide such as silicon oxide (SiO), a nitride such as silicon nitride (SiN), an oxynitride such as silicon oxynitride (SiON), combinations thereof, etc. In some embodiments, the hardmask 320 is a silicon nitride such as $Si_3N_4$.

Figure 4:
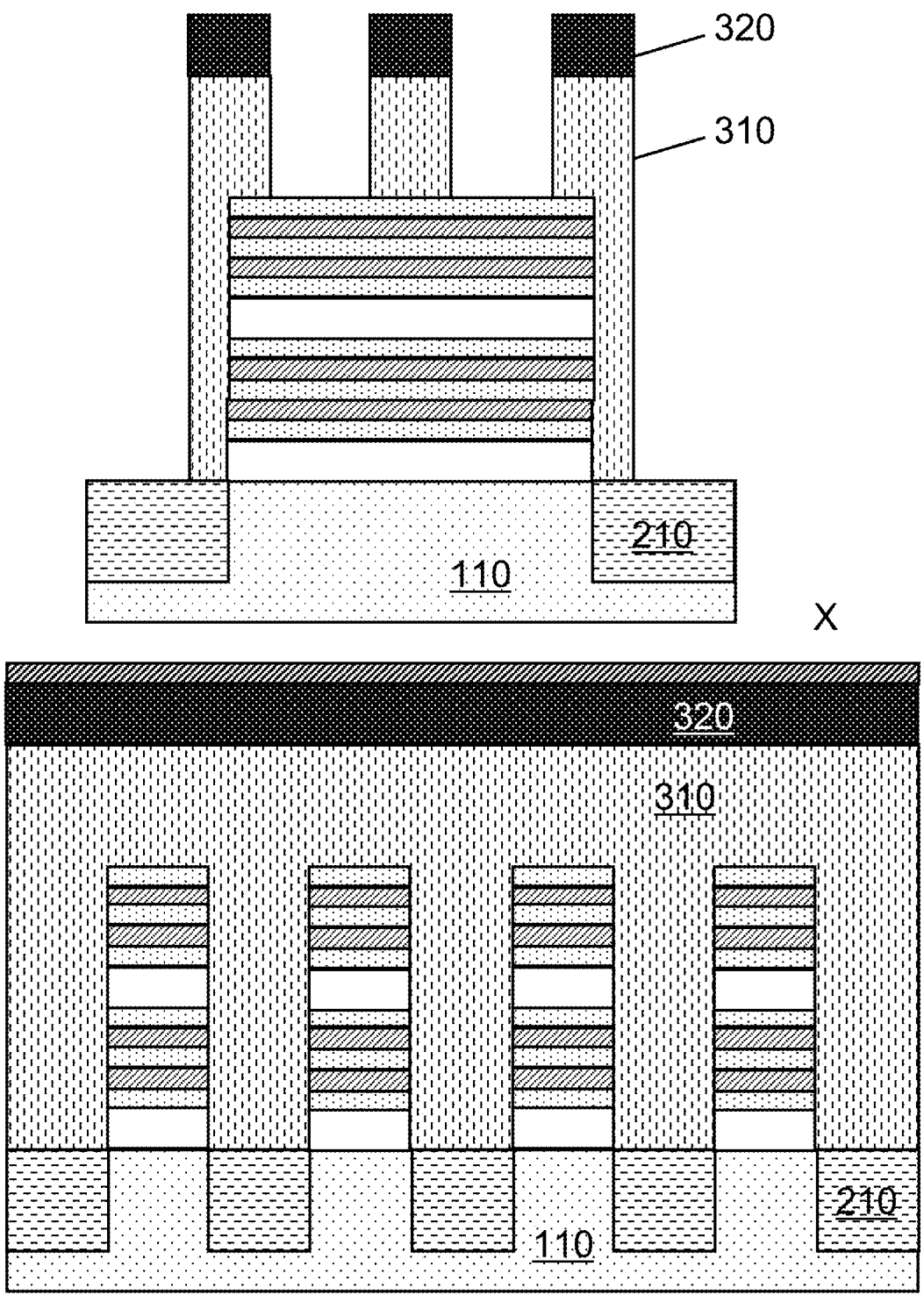
FIG. 4 provides cross-sectional views of a step in the fabrication of a semiconductor device, according to an embodiment of the invention. The figure illustrates the device after the removal of a sacrificial layer between upper and lower nanosheet stacks.

FIG. 4 illustrates the device following selective removal of sacrificial layer 120 separating the upper and lower FET devices of the CFET and separating the nanosheet stack from substrate 110. In an embodiment, the high Ge concentration SiGe of layer 120 may be selectively etched away without removal of sacrificial layers 140, or channel layers 130, due to the higher concentration of Ge of sacrificial layer 120 compared to sacrificial layers 140, or channel layers 130.

Figure 5:
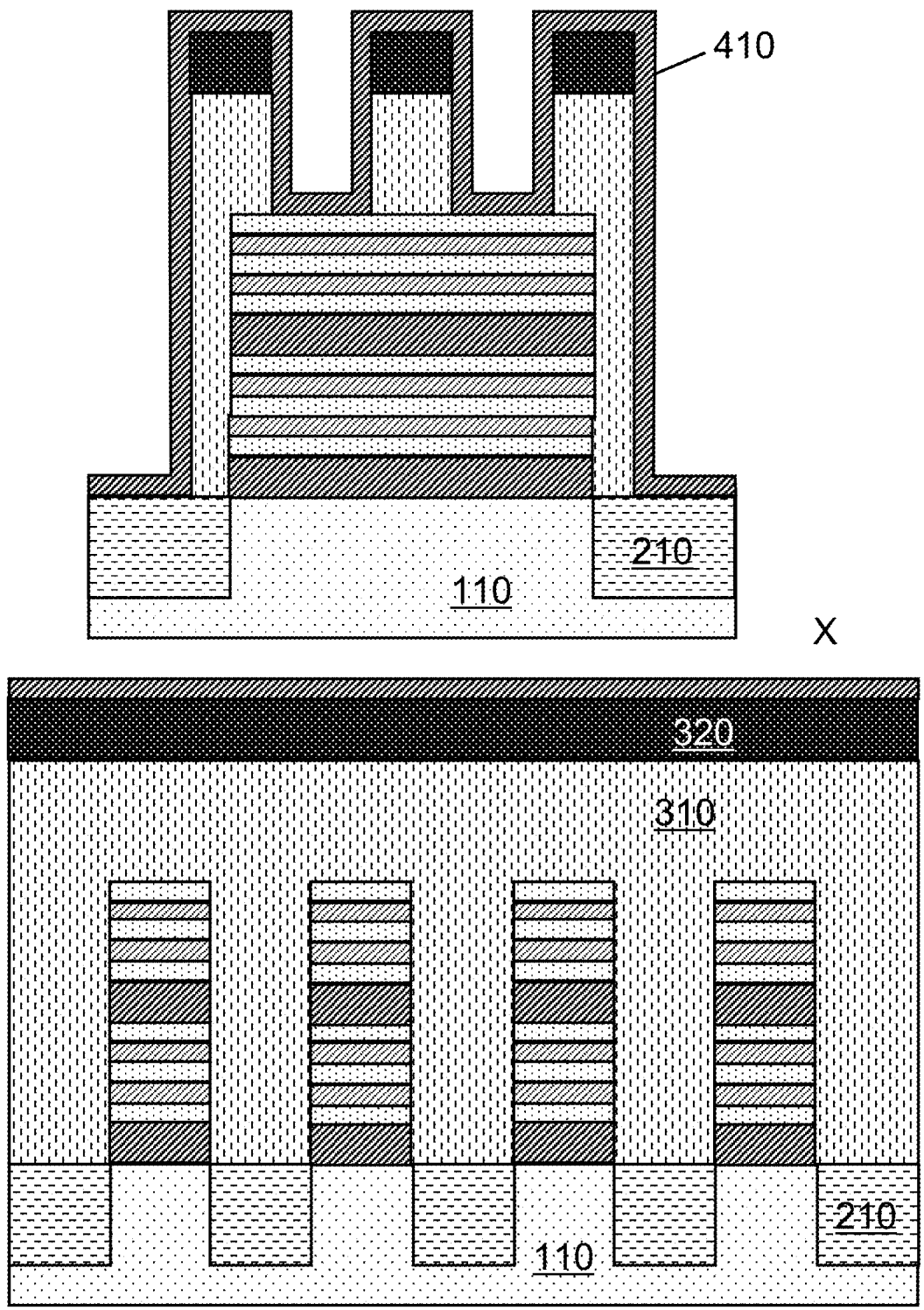
FIG. 5 provides cross-sectional views, of a step in the fabrication of a semiconductor device, according to an embodiment of the invention. The figure illustrates the device after the addition of a dielectric spacer between nanosheet devices and the addition of protective dielectric sidewalls to the dummy gate structures.

FIG. 5 illustrates the device following conformal deposition of low-k dielectric spacer materials 410, to fill the void left by removal of layer 120. Spacer material 410 further forms sidewall spacers along the sidewalls of dummy gate structure 210, and hardmask 220. In an embodiment, spacer material 410 may be the same material as hardmask 220, or may be different materials and may be comprised of any one or more of a variety of different insulative materials, such as $Si_3N_4$, SiBCN, SiNC, SiN, SiCO, $SiO_2$, SiNOC, etc.

FIG. 6 illustrates the device after selective removal of spacer sidewall materials 410 from the horizontal surfaces of the dummy gate hard mask 320. In an embodiment, anisotropic etching is used to selectively remove the horizontal surfaces of the dummy gate hard mask 320. FIG. 6 further illustrates the device following recessing the nanosheet stack layers 130, 140, and spacer layer 410, from between adjacent dummy gate structures, to form the S/D cavities for CFET devices. FIG. 6 further illustrates the device following formation of inner spacers 610 between nanosheets of the respective FET devices. Portions of nanosheet stack layers 130 and 140, which are not underneath gate spacers 410, and not underneath dummy gate 310, are removed through etching.

Etching generally refers to the removal of material from a substrate (or structures formed on the substrate) and is often performed with a mask in place so that material may selectively be removed from certain areas of the substrate, while leaving the material unaffected, in other areas of the substrate.

There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching.

After generally etching the nanosheet stack between the dummy gate structures to the upper surface of the dielectric isolation layer 410, a selective etching of SiGe layers 140 of the nanosheet stack removes portions which are underneath gate spacers 410. Inner spacers 610 are then formed in etched-away portions, and thus are located under gate spacers 410. Inner spacers 610 can be composed of any suitable dielectric material, for example $Si_3N_4$, SiBCN, SiNC, SiN, SiCO, SiO$_2$, SiNOC, etc. The inner spacers are formed by a conformal dielectric liner deposition followed by isotropic etching back, so dielectric liner is removed everywhere except the regions pinched-off in those under spacer cavities.

FIG. 7 illustrates the device following epitaxial growth of source/drain regions 710, for the lower FET device of the CFET. In an embodiment, pairs of lower epitaxial source/drain regions are formed on opposing sides of nanosheet stacks and dummy gate structures. In an embodiment, boron doped SiGe (SiGe:B) is epitaxially grown from exposed semiconductor surfaces (layer 130) for the formation of p-type FET device on the bottom. In an embodiment, deposition of a sacrificial material, such as OPL, covers the bottom nanosheet channel 130 sidewalls. A sacrificial spacer, such as a thin SiO$_2$ or SiN, then covers the top nanosheet channel 130 sidewalls, preventing epitaxial growth from these channels. The sacrificial material, such as OPL, can be removed by N2/H2 ash, followed by bottom p-type S/D epitaxial 710 growth. After that, the sacrificial spacer can be removed from the top nanosheet channel 130 sidewalls. Growth of bottom S/D regions 710 includes overgrowth of the regions followed by recessing, patterning and selectively etching away unwanted epitaxial growth, leaving the final desired S/D region elements.

In the present embodiments, the source/drain regions 710 may be doped in situ by adding one or more dopant species to the epitaxial material. The dopant used will depend on the type of FET being formed, whether p-type or n-type. As used herein, "p-type" refers to the addition of impurities to an intrinsic semiconductor that creates deficiencies of valence electrons. In a silicon-containing semiconductor, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous. In an embodiment, the upper S/D regions of the device comprise n-type material and the lower regions comprise p-type materials. In an embodiment, the upper S/D regions comprise p-type materials and the lower regions comprise n-type materials.

FIG. 7 further illustrates the device following deposition, and recess of a dielectric spacer layer 720, composed of any suitable dielectric material, for example Si$_3$N$_4$, SiBCN, SiNC, SiN, SiCO, SiO$_2$, SiNOC, etc. This can be achieved by a conformal deposition of dielectric spacer 720 to pinch-off the gate-to-gate space or just overfill the sacrificial spacer material then followed by a CMP to a desired upper surface height for the dielectric spacer 720.

FIG. 7 further illustrates the device following epitaxial growth of upper FET source/drain regions 730 in a manner similar to that used for the formation of lower FET source/drain regions 710. In an embodiment, the lower device FETs comprise p-type devices and the upper FETs comprise n-type devices. This should not be construed as limiting the invention as the lower devices may comprise n-type devices and the upper FETs may comprise p-type devices. In an embodiment, each set of upper or lower devices comprise a single polarity (n-type or p-type) with the other set comprising the opposite polarity.

FIG. 8 illustrates the device following selective removal of dummy gate hard mask 320 and deposition of interlayer dielectric (ILD) material 810, such as FCVD of a flowable dielectric such as SiO$_2$, or a similar material. ILD 810 fills the spaces between otherwise adjacent dummy gate structures. CMP follows ILD deposition to recess the dummy gates to the desired height for the device.

FIG. 9 illustrates the device following the selective removal of dummy gate material 310 as well as the removal of sacrificial nanosheets 140, freeing the nanosheet channels 130 of the device.

FIG. 10 illustrates the device following successive deposition of a high-k liner layer and a protective liner, such as TiN, depicted together as reference item 1010, and a place holder spacer material 1020, such as amorphous silicon around the nanosheet channels, the gate sidewalls, and the low-k spacers.

FIG. 11 illustrates the device following recessing of the spacer material 1020, exposing the upper device channels 130, as well as the dielectric separator between upper and lower devices.

FIG. 12 illustrates the device following conformal deposition of a protective dielectric liner 1210, such as SiN, or a similar dielectric material. The figure further illustrates the deposition of an oxide layer 1220, though, for example an FCVD process. Exemplary oxide materials include SiO$_2$, SiOC, SiON, and SiOCN FIG. 13 illustrates the device following selective etching of the protective oxide 1220 and dielectric layers 1210, as well as removal of the protective liner material 1010 from the exposed surfaces of the upper FET devices. Removal of the protective liner 1010, such as TiN reduces the possibility of electrical short circuits between the upper and lower devices. The high-k liner portion of liner 1010 remains in place on the exposed upper FET surfaces.

Figure 14:
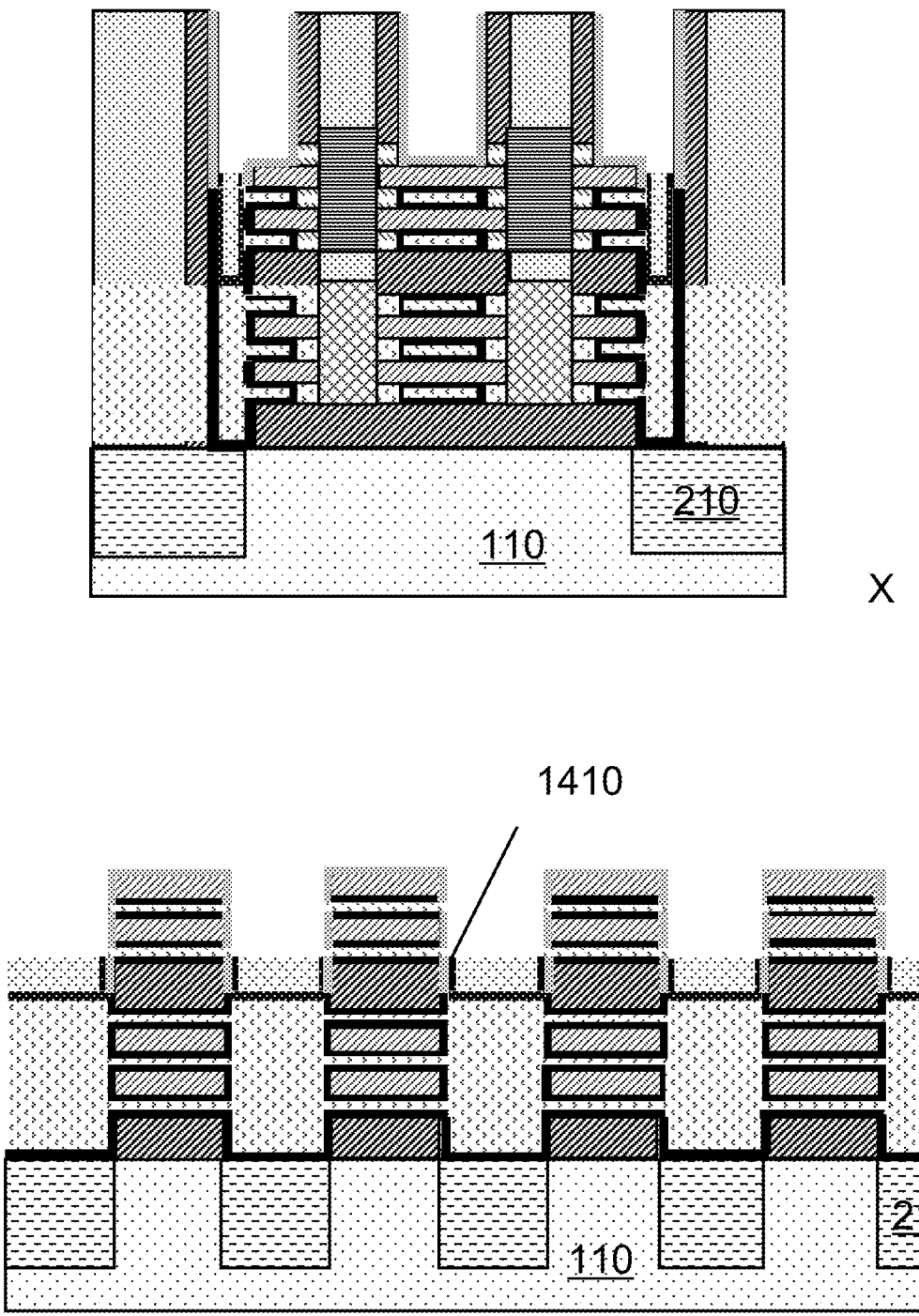
FIG. 14 provides cross-sectional views of a step in the fabrication of a semiconductor device, according to an embodiment of the invention. The figure illustrates the device after deposition of dielectric materials to backfill spaces between the upper and lower FET device nanosheet stacks.

FIG. 14 illustrates the device following deposition of inner spacer materials 1410 in the voids left after removal of protective liner material 1010. Deposition of the inner spacer dielectric material 1410 fills the void spaces and contributes to the composite dielectric spacer layer between the eventual upper and lower FET devices.

FIG. 15 illustrates the device following selective removal of the remaining amorphous silicon from between upper FET nano sheets 130 followed by removal of protective liner portions from composite liner 1010 from between the nanosheet channels 130 and from the horizontal surface between otherwise adjacent gate structures. The high-k portion of protective liner 1010 remains disposed upon the upper FET device channels 130. FIG. 16 illustrates the device following the formation of the high-k metal gate (HKMG) stack. As shown in the Figure, a replacement metal gate structure has been formed in the void space created by removal of the spacer material 1020. Gate structure includes high-k gate dielectric 1010 and gate metal layers 1610. The high-k gate dielectric 1010, is generally a thin film and can be silicon oxide, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as lanthanum, aluminum, magnesium. Gate dielectric can be deposited by CVD, ALD, or any other suitable technique. Metal gates can include any known metal gate material known to one skilled in the art, e.g., TiN, TiAl, TiC, TiAlC, tantalum (Ta) and tantalum nitride (TaN), W, Ru, Co, Al. Metal gates may be formed via known deposition techniques, such as atomic layer deposition, chemical vapor deposition, or physical vapor deposition. It should be appreciated that a chemical mechanical planarization (CMP) process can be applied to the top surface. In an embodiment, the replacement metal gate includes work-function metal (WFM) layers 1620, (e.g., titanium nitride, titanium aluminum nitride, titanium aluminum carbide, titanium aluminum carbon nitride, and tantalum nitride) and other appropriate metals and conducting metal layers 1610 (e.g., tungsten, cobalt, tantalum, aluminum, ruthenium, copper, metal carbides, and metal nitrides). The term work function metal includes a single metal layer as well as a stack of metal layers, or surface dipoles combined with a single or stack of metal layers. After formation and CMP of the HKMG, the HKMG can be optionally recessed followed by a deposition and CMP of a gate cap dielectric material (not shown), such as SiN, or similar materials, completing the replacement metal gate fabrication stage for the device.

In an embodiment, each upper FET device includes a different WFM surrounding the nanosheet channels 130 of the device. Each WFM imparts a particular voltage threshold to the individual device such that each device has a different voltage threshold depending upon the particular WFM used for the device. Device WFM are applied in successive steps including the masking of all devices with an OPL layer followed by selective exposure of a target device and deposition of the target device WFM. This is followed by removal of the remaining OPL and deposition of new OPL followed by selective exposure of a different target upper FET and deposition of the WFM for the new target. This iterative process continues until completion of deposition of WFM for all upper FET devices. Following the final WFM deposition, removal of the remaining OPL prepares the device for deposition of the gate metal conducting material layers.

Figure 17:
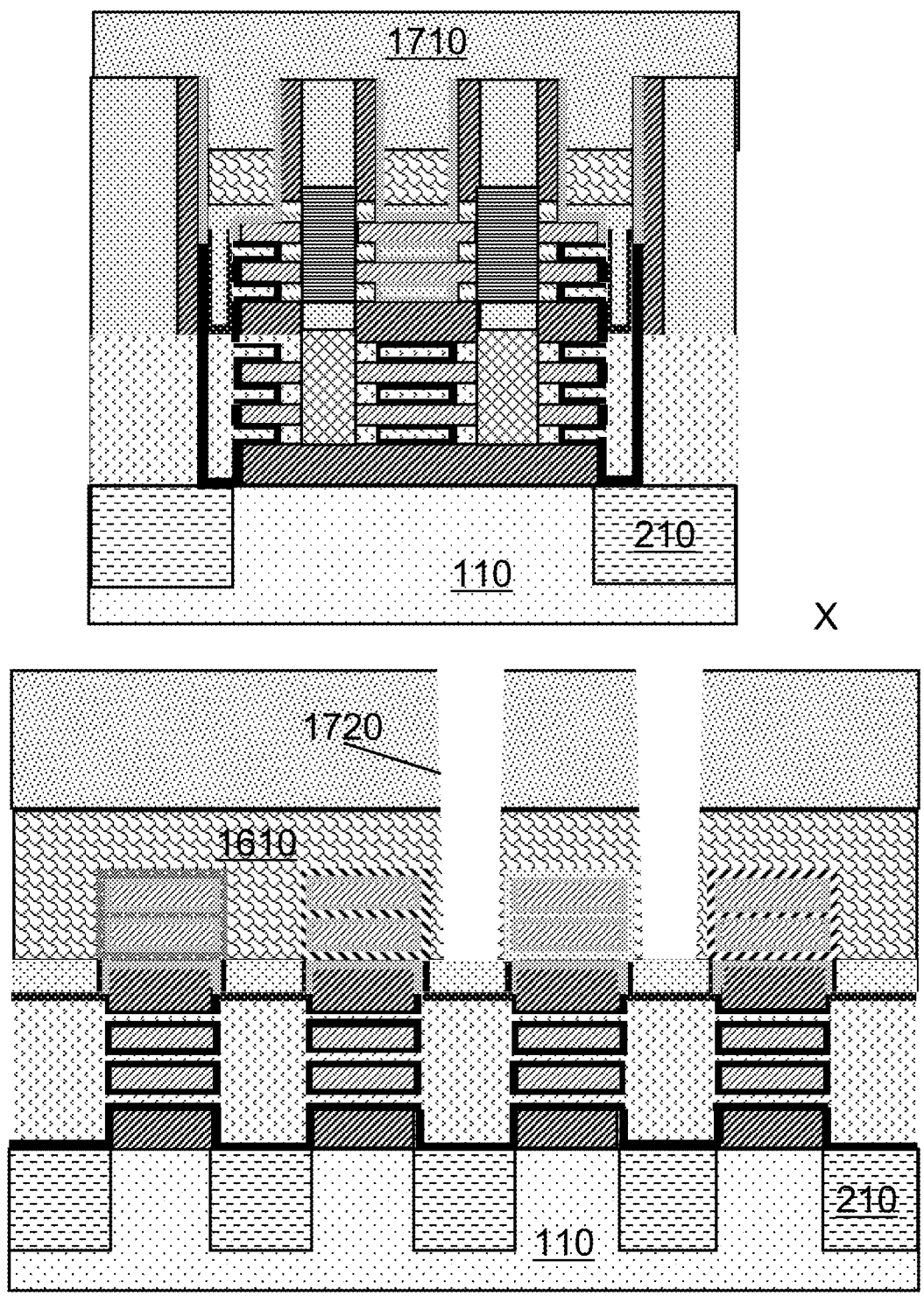
FIG. 17 provides cross-sectional views of a step in the fabrication of a semiconductor device, according to an embodiment of the invention. The figure illustrates the device after formation of trenches isolating adjacent upper and lower FET stacked devices.

FIG. 17 illustrates the device following the recessing of gate material 1610, and deposition and patterning of an OPL mask 1710, and formation of deep device separating trenches 1720, separating upper FET devices. Such trenches 1710 pass through OPL 1710 and gate metal 1610, to oxide layer 1220.

FIG. 18 illustrates the device following the deposition of dielectric material 1830 in the device cuts and above the gate metal 1610, as well as metal S/D contact 1810 in the S/D regions contact vias. In an embodiment, deposition of silicide liner such as Ti, Ni, Co, NiPt, followed by deposition of an adhesion metal liner, such as a thin layer of TiN, followed by deposition of a conductive metal such as Cu, Ag, Au, W, Co, Ru, or combinations thereof, forms the contact. The geometry of the contact reduces the contact resistance by increasing the silicide surface area between the contact and S/D epi with the S/D regions. As further shown in the Figure, contacts 1810 for the device S/D regions are protected by caps 1820, such as SiC or similar materials. FIG. 18 further illustrates the device following deposition of sacrificial cap dielectric isolation materials, such as SiN or similar materials, in the shallow and deep device trenches 1720, as well as above gate metal layer 1610.

Figure 19:
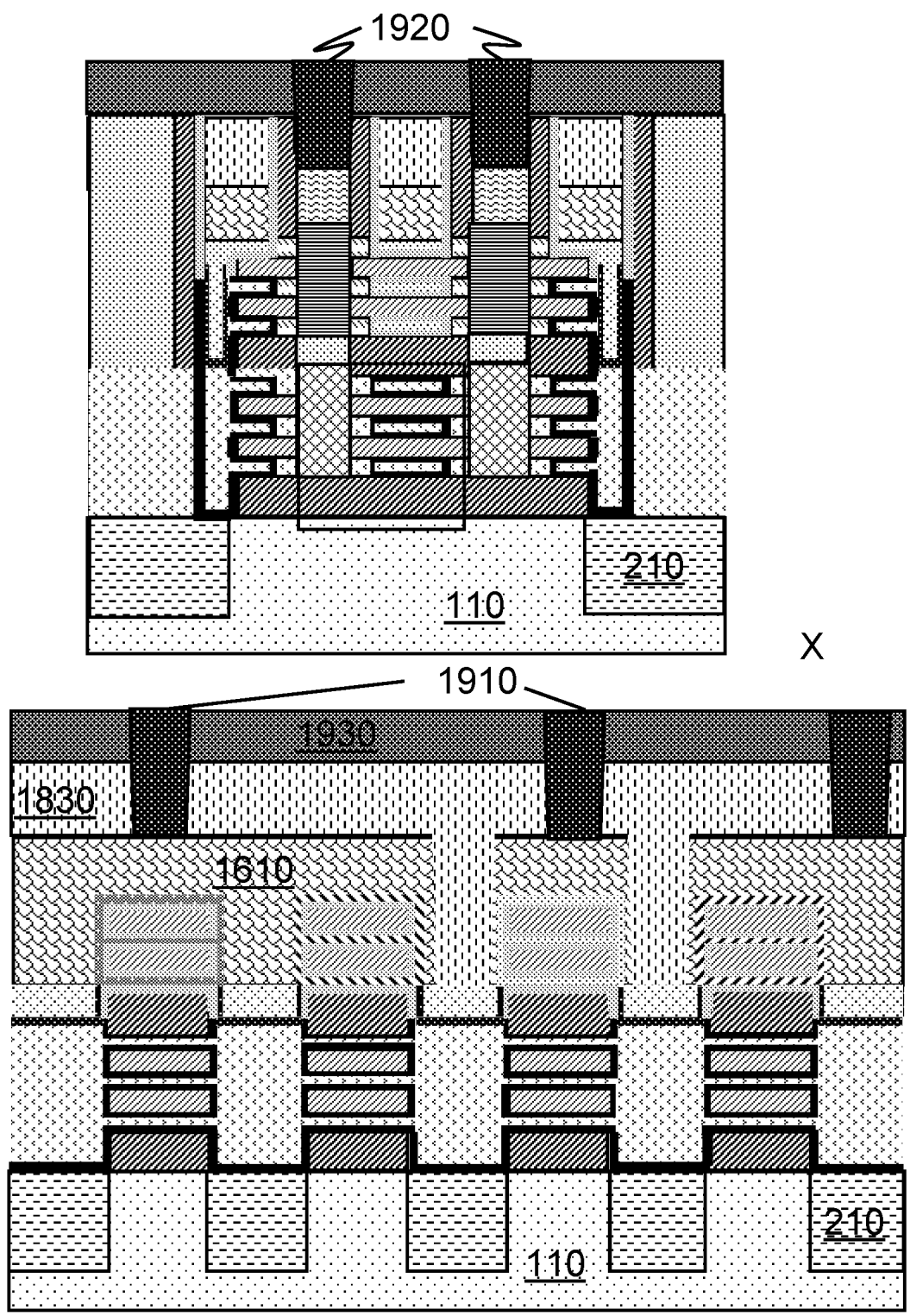
FIG. 19 provides cross-sectional views of a step in the fabrication of a semiconductor device, according to an embodiment of the invention. The figure illustrates the device after the formation of middle-of-line upper device S/D and gate contacts.

FIG. 19 illustrates the device following formation of middle-of-line upper device gate contacts 1910 and S/D region contacts 1920. As shown in the Figure, a trench metal deposition process yields a metallized layer adjacent to and above the S-D region contacts 1810, and gate metal layer 1610, and through interlayer dielectric 1930 and dielectric cap 1830. In an embodiment, formation of the trench metal layer includes forming a silicide layer between, for example, contact and S/D contact 1810, (e.g., Ni silicide, Ti silicide, NiPt silicide, Co silicide, etc.) followed by forming metallization materials above the silicide (e.g., a thin adhesion metal such as TiN and a bulk metal fill such as Co, W, Ru, etc., followed by CMP.

Figure 20:
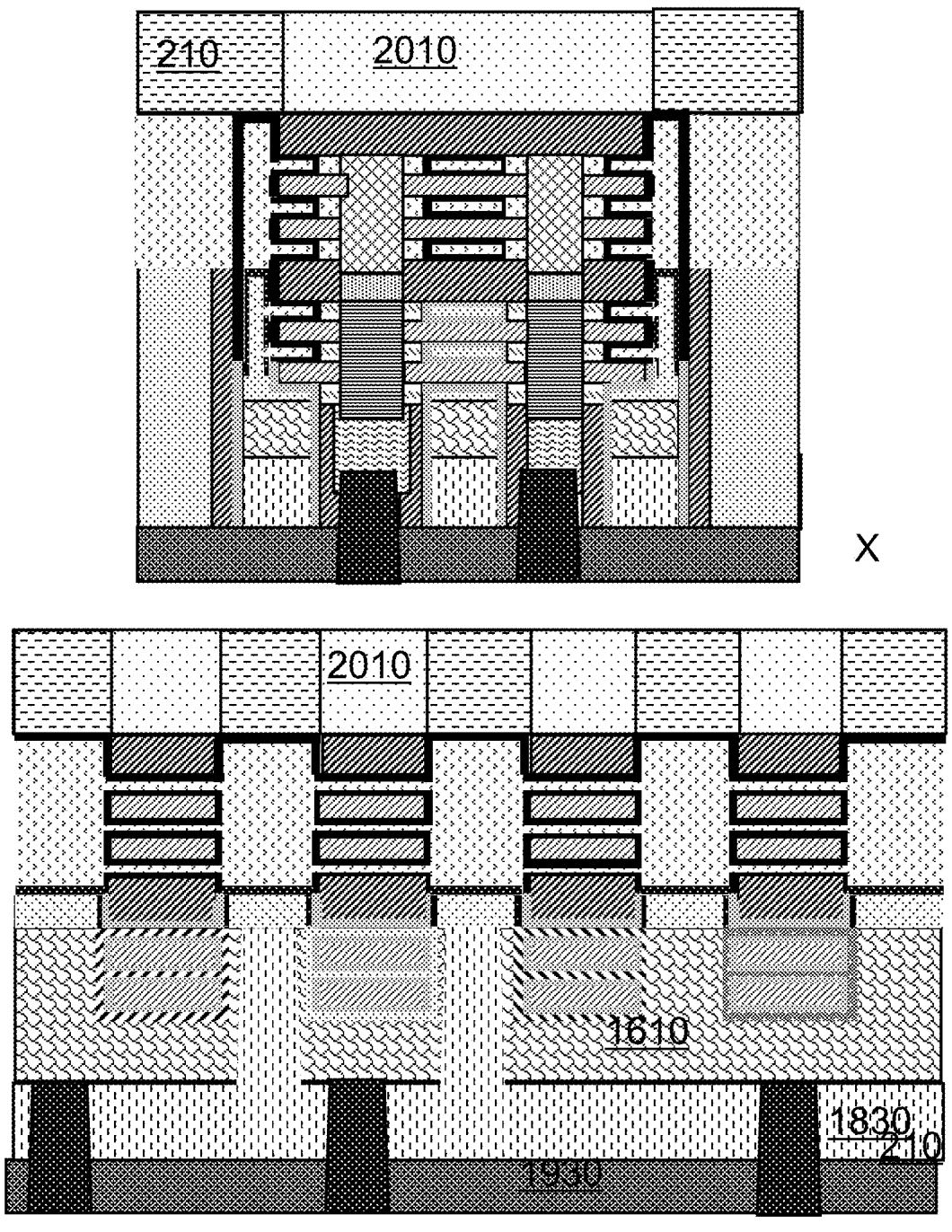
FIG. 20 provides cross-sectional views of a step in the fabrication of a semiconductor device, according to an embodiment of the invention. The figure illustrates the device after wafer inversion and chemical mechanical planarization to the shallow trench isolation regions.

FIG. 20 illustrates the device following successive back end of line (BEOL) fabrication steps for the device elements above the CFET elements. Following the BEOL fabrication, the processed wafer is releasably attached to a carrier wafer and inverted, exposing underlying substrate 110. Following inversion, CMP of substrate 110 exposes STI 210, selective etching recesses and removes the remaining portions of substrate 110, exposing bottom dielectric 410. An overfill deposition of a backside inter-layer dielectric 2010, follows selective removal of remaining portions of substrate 110. CMP of backside inter-layer dielectric 2010, follows, stopping at STI 210.

Figure 21:
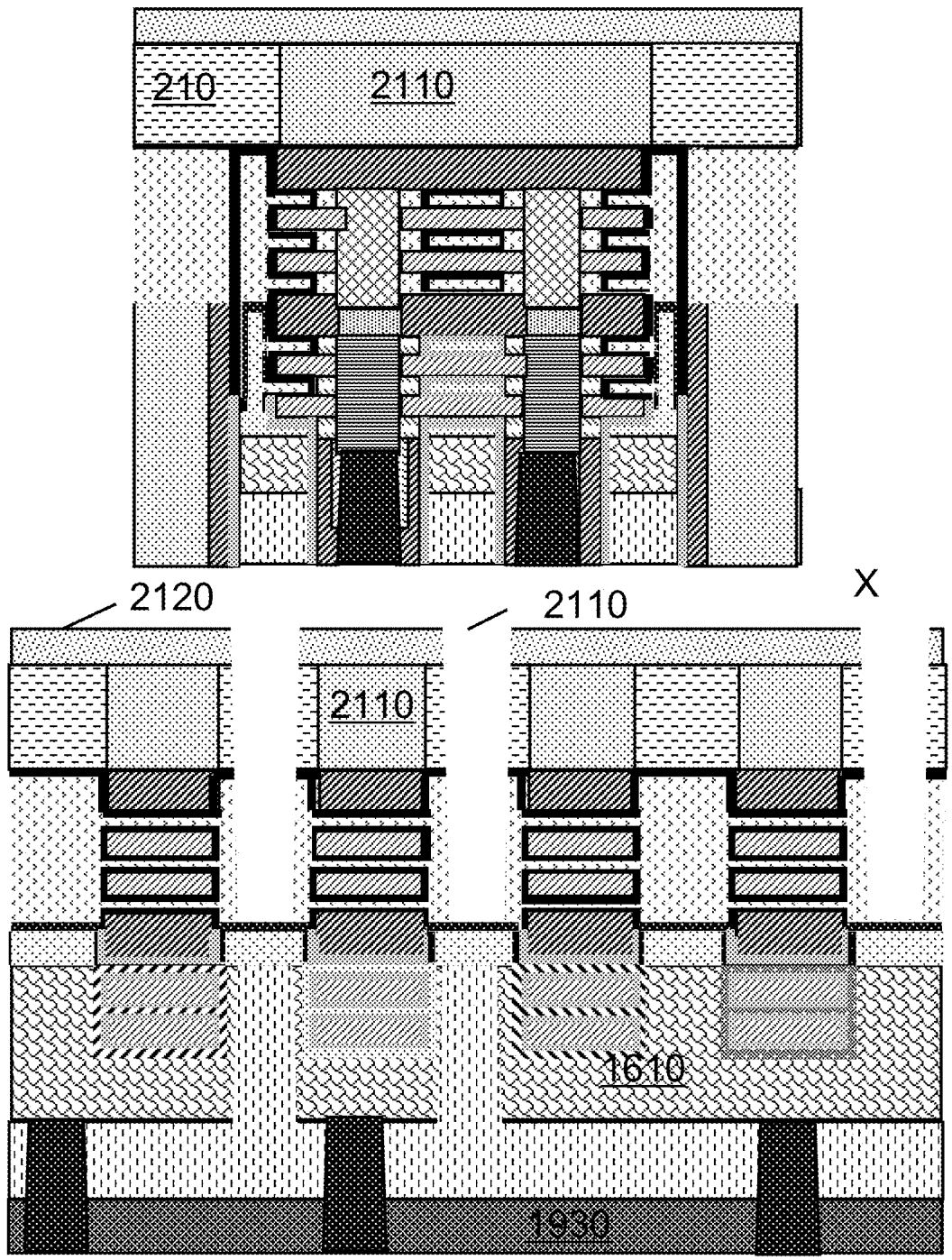
FIG. 21 provides cross-sectional views of a step in the fabrication of a semiconductor device, according to an embodiment of the invention. The figure illustrates the device after patterning and cutting of bottom device isolation trenches.

FIG. 21 illustrates the device following the etching of device isolation trenches, 2110, between adjacent bottom FET device gate structures. Selective etching, such as RIE, follows deposition and patterning of a protective OPL layer 2120, forming the device isolation trenches 2110.

Figure 22:
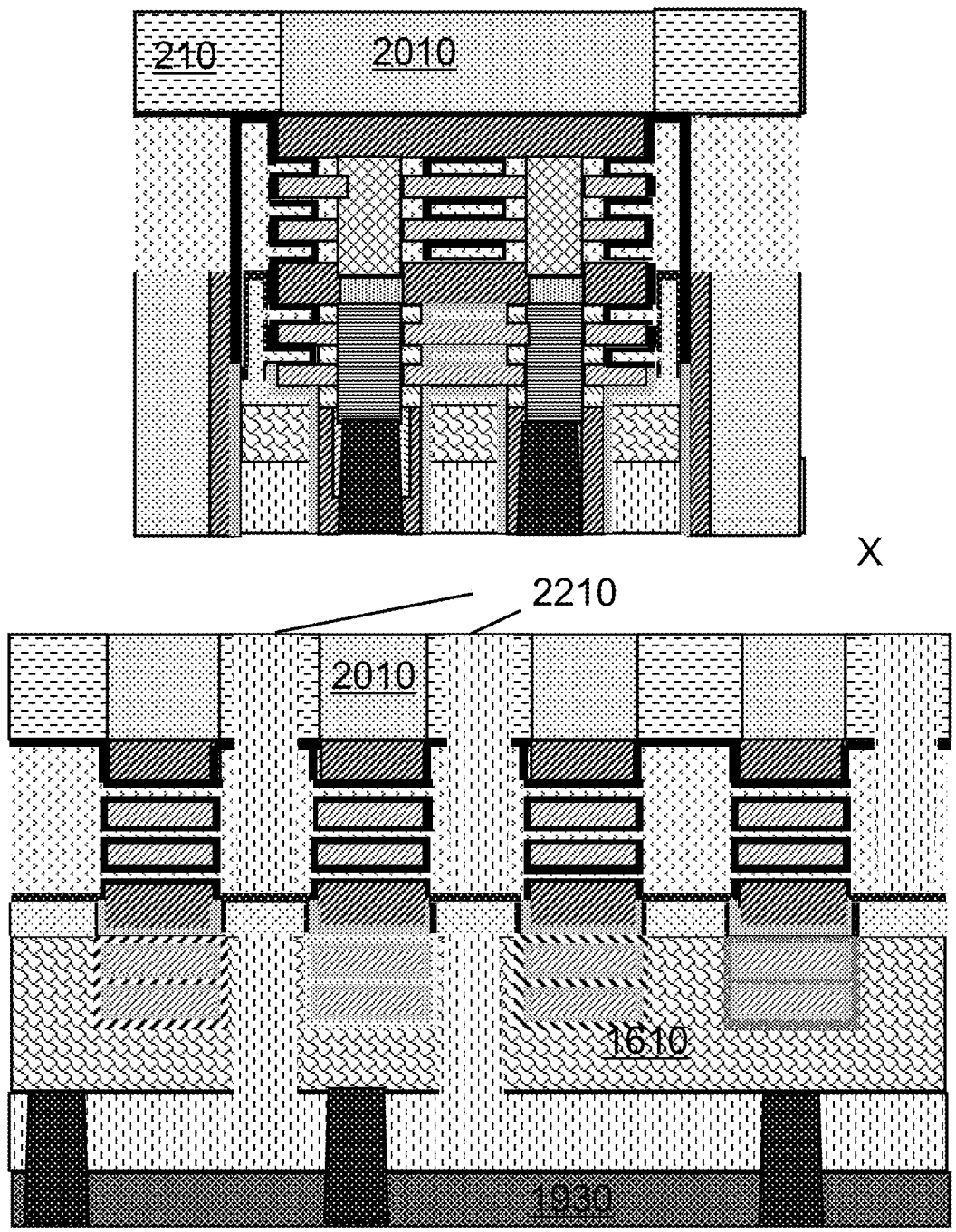
FIG. 22 provides cross-sectional views of a step in the fabrication of a semiconductor device, according to an embodiment of the invention. The figure illustrates the device after filling the bottom device isolation trenches.

FIG. 22 illustrates the device following the ashing of OPL 2120 and deposition of a device isolating dielectric 2210 in the device isolation trenches 2110. Exemplary isolation materials include SiC or similar materials.

Figure 23:
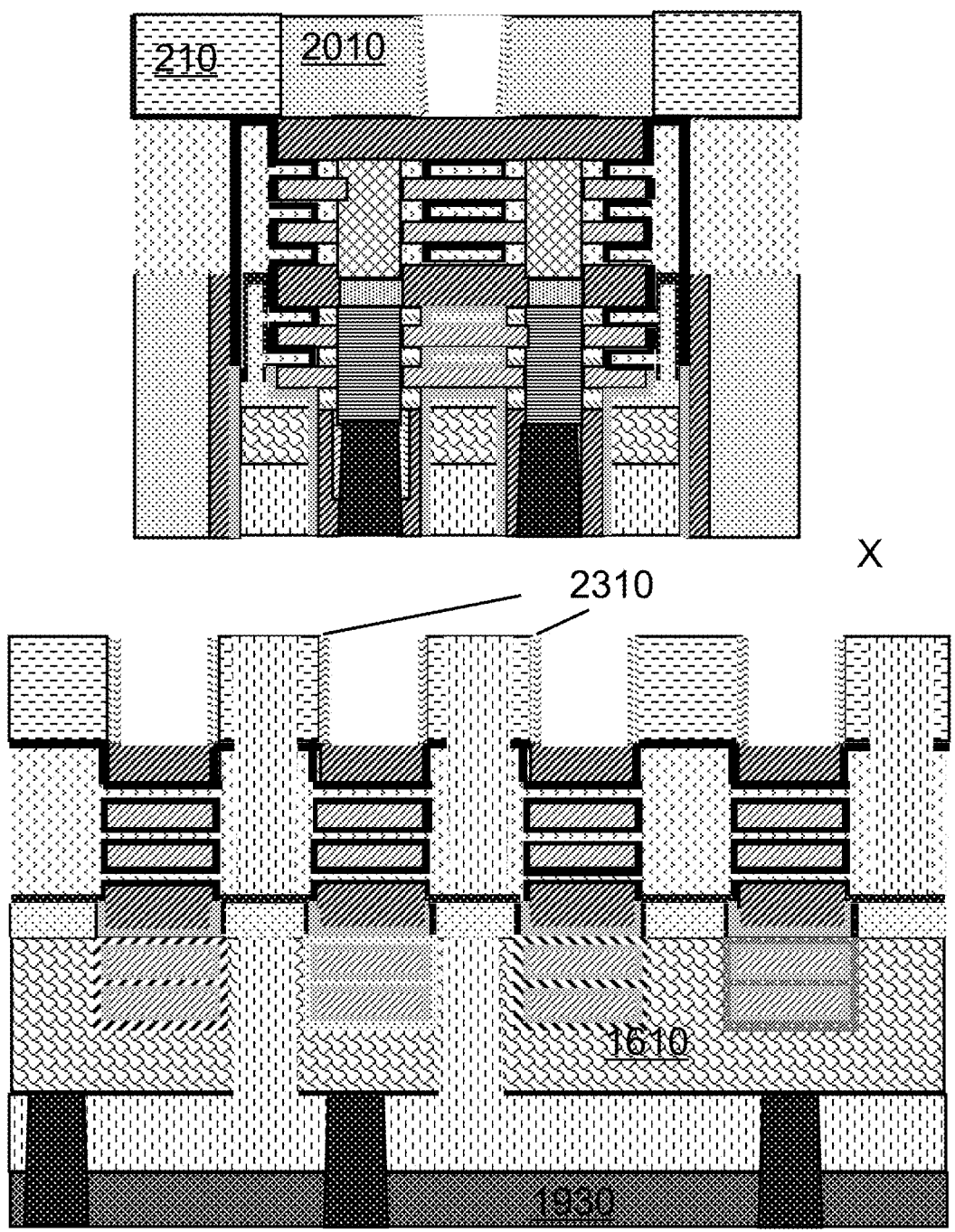
FIG. 23 provides cross-sectional views of a step in the fabrication of a semiconductor device, according to an embodiment of the invention. The figure illustrates the device after etching to expose the bottom FET device dielectric isolation layer.

FIG. 23 illustrates the device following removal by etching, such as RIE, of dielectric 2010 exposing device gate channels 130, and dielectric spacer 410. The figure further illustrates the device following conformal deposition and selective etch back of a dielectric spacer layer 2310, such as SiBCN, or other low-k materials. Selective etching after the conformal deposition leaves a sidewall spacer layer between about 2 nm and about 10 nm in thickness. Dielectric sidewall spacer material 2310 differs from STI 210, dielectric spacer 2010, and dielectric spacer 410, enabling selective removal of the respective materials.

Figure 24:
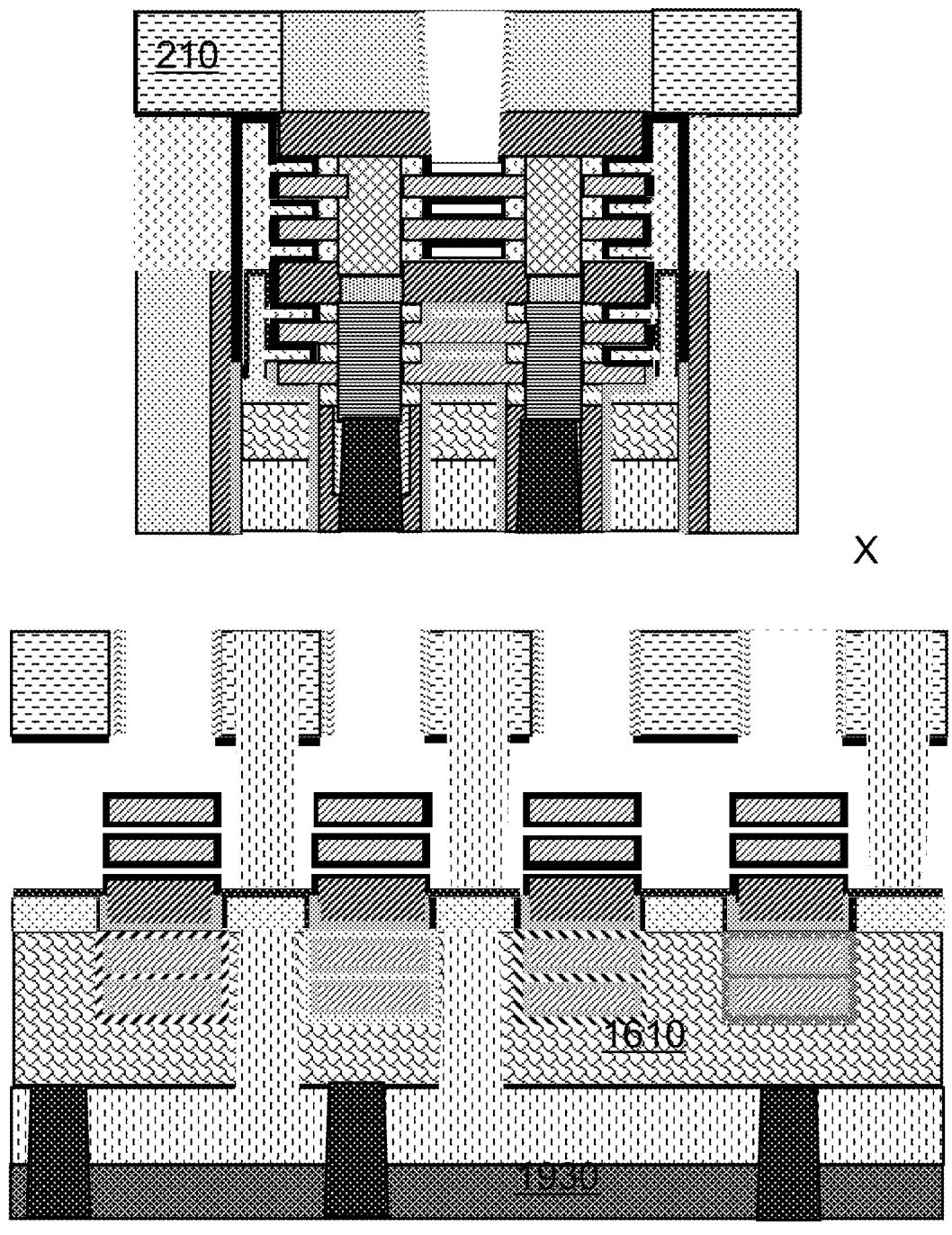
FIG. 24 provides cross-sectional views of a step in the fabrication of a semiconductor device, according to an embodiment of the invention. The figure illustrates the device after selective etching to expose bottom FET device nanosheet channels with dielectric liners.

FIG. 24 illustrates the device following selective etching to remove dielectric spacer 410 as well as amorphous silicon spacer material 1020 from between lower device channels 130.

FIG. 25 illustrates the device following deposition and selective patterning of OPL 2510 exposing device channels 130 of a single bottom FET device. The figure further illustrates selective etching of dielectric spacers 1410, between the bottom FET and top FET, exposing portions of the WFM of the top FET device.

FIG. 26 illustrates the device following removal of remaining OPL materials as well as removal of protective liner layer of composite liner 1010, from around the device channels 130 and the dielectric spacers 410.

Figure 27:
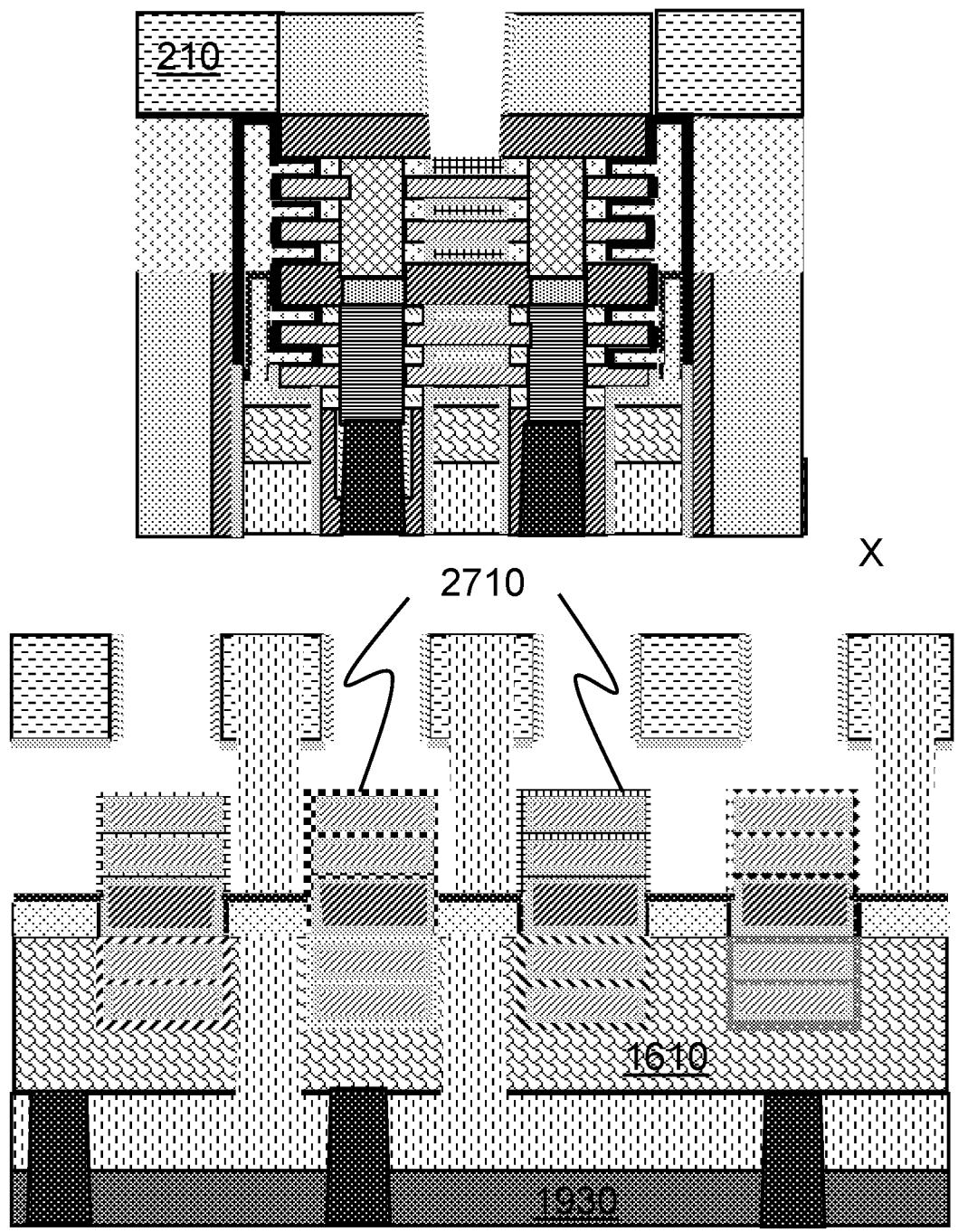
FIG. 27 provides cross-sectional views of a step in the fabrication of a semiconductor device, according to an embodiment of the invention. The figure illustrates the device after the successive deposition of work function metals for the four bottom FET devices.

FIG. 27 illustrates the device following deposition of bottom device WFM 2710, around the channels 130 of each of the four illustrated devices. WFM deposition proceeds as described with regard to the upper FET devices. OPL material is successively deposited and patterned exposing the channels 130 of each bottom FET in turn. The method deposits a WFM around the channels 130 of the exposed bottom FET and removal of the remaining OPL follows. Similarly to the upper FET devices, each bottom FET device includes a different WFM enabling different voltage thresholds for each bottom FET device.

Figure 28:
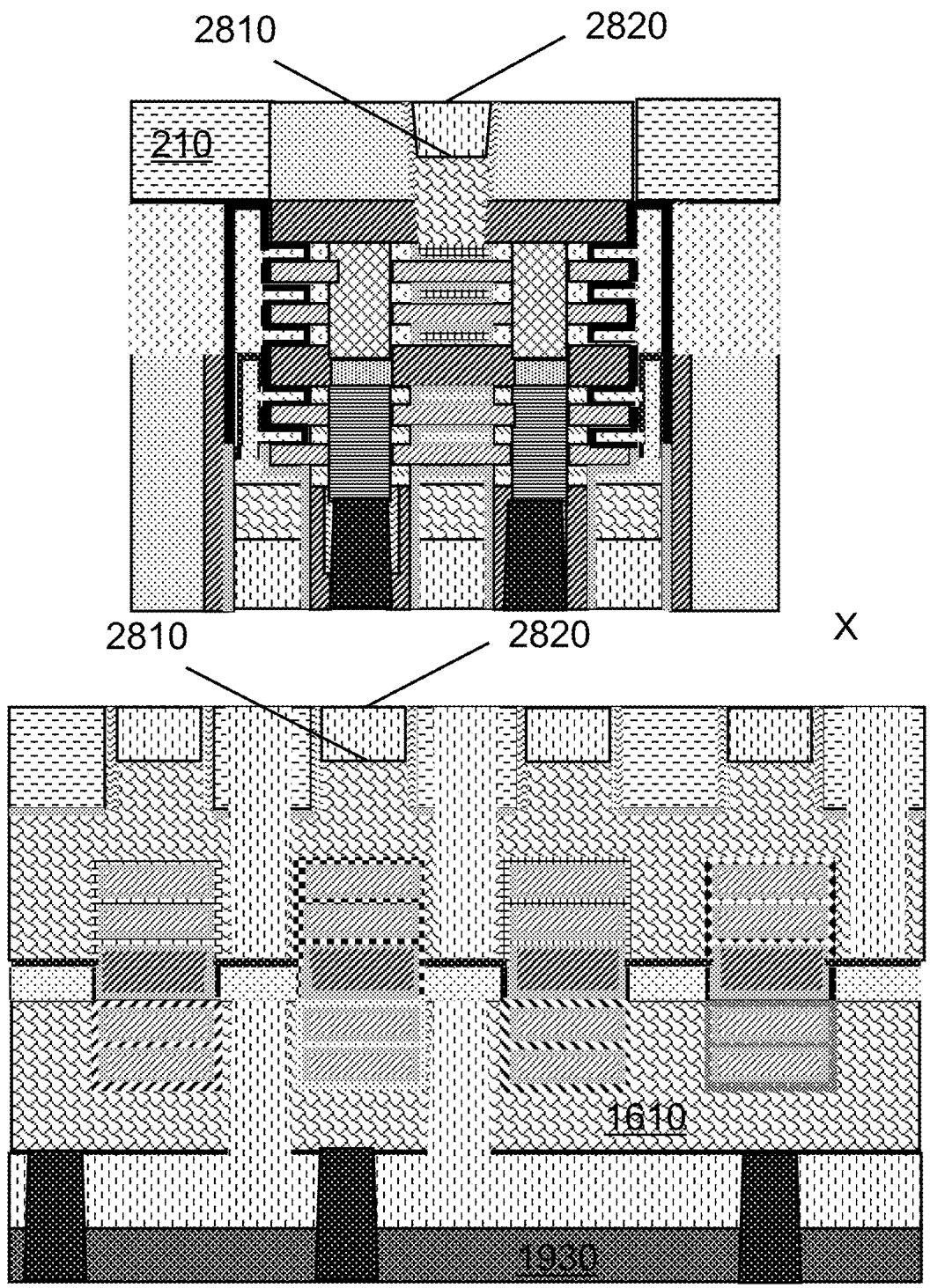
FIG. 28 provides cross-sectional views of a step in the fabrication of a semiconductor device, according to an embodiment of the invention. The figure illustrates the device after the formation bottom FET gate contacts and accompanying sacrificial caps.

FIG. 28 illustrates the device following the formation of bottom device gate contacts 2810, and sacrificial caps 2820, in a manner similar to that set forth above for upper gate contacts 1810 and sacrificial caps 1820.

Figure 29:
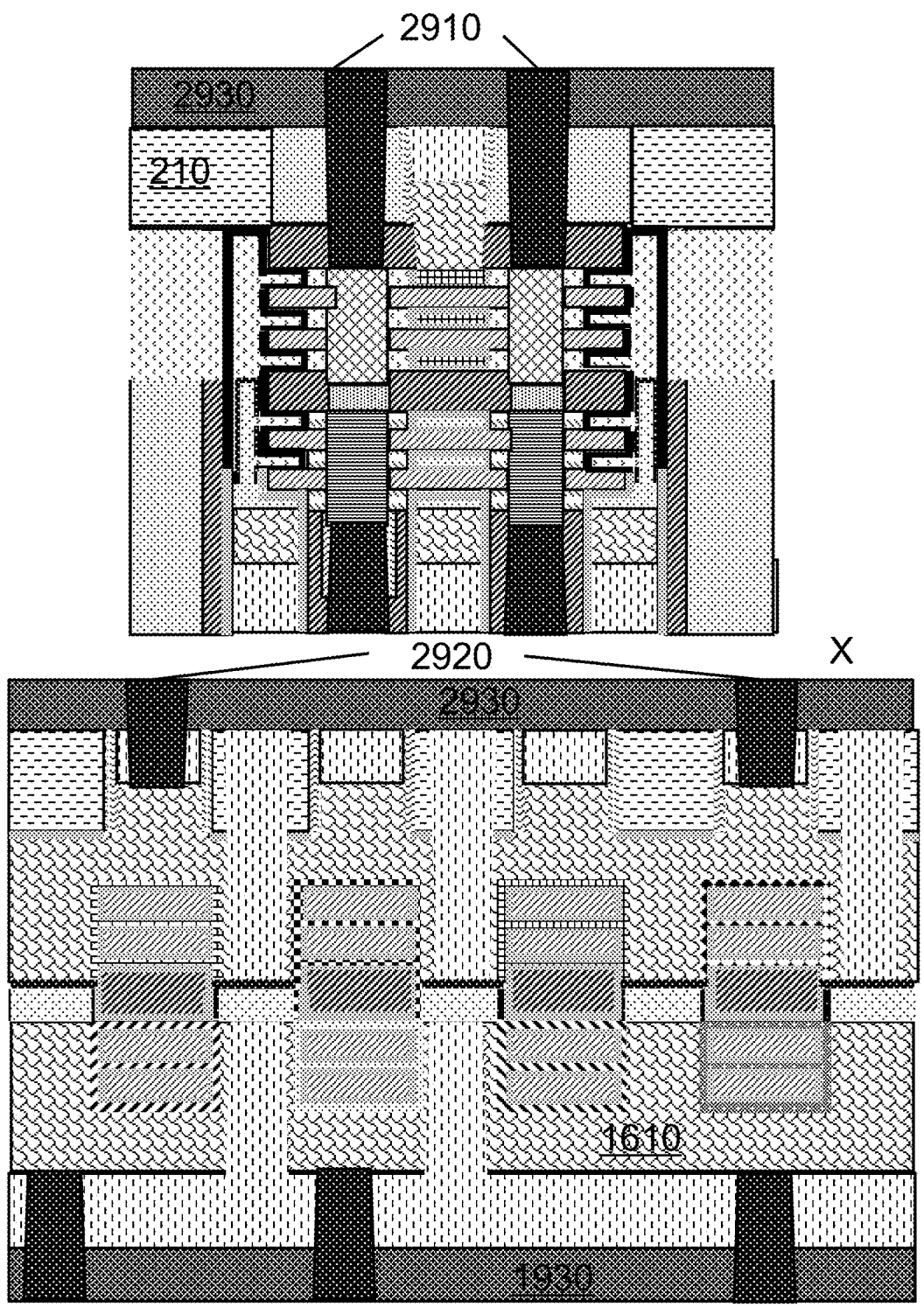
FIG. 29 provides cross-sectional views of a step in the fabrication of a semiconductor device, according to an embodiment of the invention. The figure illustrates the device after the formation of middle of line device gate and S/D contacts for the bottom FET devices.
Figure 30:
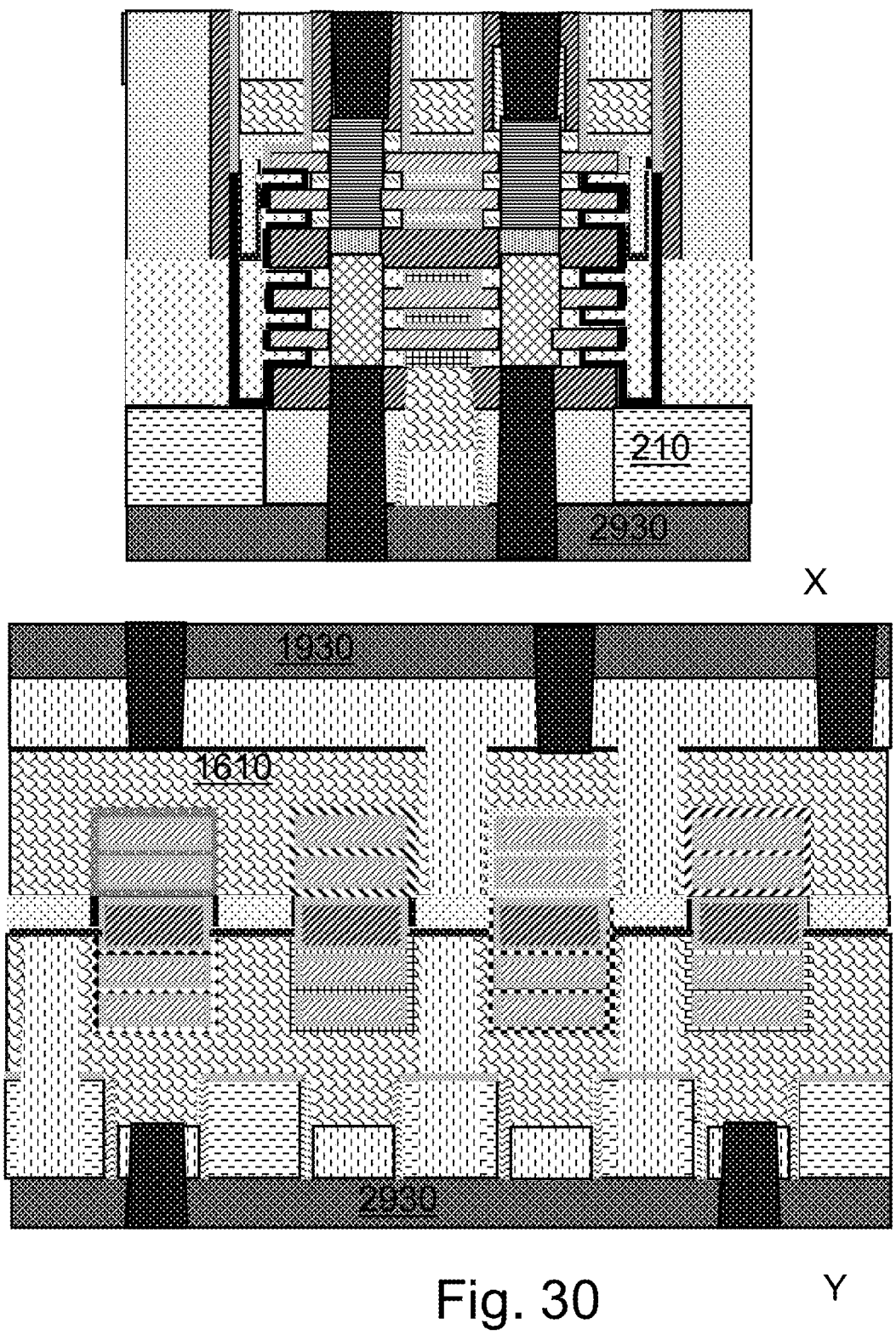
FIG. 30 provides cross-sectional views of a step in the fabrication of a semiconductor device, according to an embodiment of the invention. The figure illustrates the device after fabrication of bottom power distribution circuitry and inversion of the fabricated CFET devices.

FIG. 29 illustrates the device following formation of bottom FET middle-of-line (MOL) S/D contacts 2910, and gate contacts 2920, through ILD 2930, in a manner similar to that described above with regard to contacts 1910 and 1920 for the upper FETs. Fabrication proceeds with formation of bottom power distribution rails formed beneath the bottom FET structures. FIG. 30 illustrates the device following fabrication of BEOL contacts and power distribution network and inversion of the device.

Figure 31:
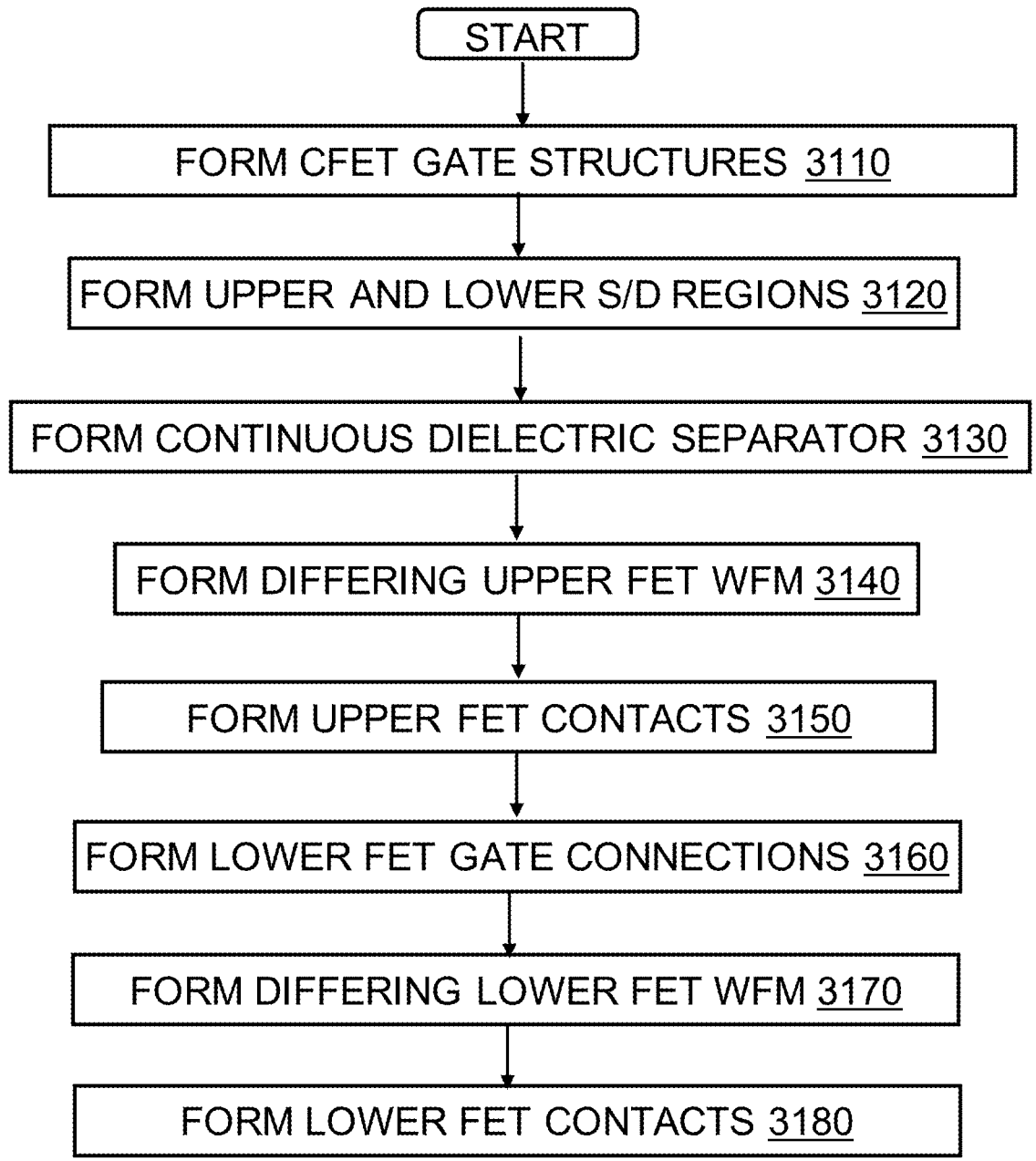
FIG. 31 provides a flowchart depicting operational steps for forming semiconductor device, according to an embodiment of the invention.

FIG. 31 depicts a fabrication process flowchart 3100, according to an embodiment of the invention. As shown in flowchart 3100, At block 3110, the method forms CFET gate structures. Stacks of alternating nanosheet layers of differing semiconductor materials are epitaxially grown upon an underlying substrate, or upon an insulating layer disposed upon a substrate. The stacks include sacrificial layers and channel layers. The channel layers form the nanosheet channels of the upper and lower FETs of the CFET. The layers are patterned and etched to form fins upon the underlying substrate. Dummy gate structures including gate sidewall spacers are added atop and along the fins. The nanosheet layers are recessed to align with the dummy gate spacers and inner spacers between nanosheet channel layers are formed to isolate the gates from the S/D regions of the devices.

At block 3120, the method grows upper and lower S/D regions from the nanosheet channels for the CFET gate structures. A set of intermediate layers including a high-k dielectric layer, a protective liner layer, and a spacer layer, such as amorphous silicon, are disposed upon exposed device nanosheet channels of a nanosheet stack. Vertical dielectric inner spacers are formed between otherwise adjacent bottom FET gate structures. Such inner spacers isolate the device gates of otherwise adjacent bottom FET devices of the CFETs. In-gate inner spacers are disposed between upper and lower FETs of each CFET of the overall device. Such in-gate isolation spacers separate upper and lower device gate regions. Upper FET spacer materials, such as amorphous silicon, are removed from the upper FET nanosheet channels, exposing the high-k and protective liners. The protective liner layers are also removed exposing the high-k liner layers surrounding the upper device nanosheet channels.

At block 3130, the method forms a continuous dielectric separation layer between upper and lower FET devices. The dielectric separator may comprise a composite of dielectric elements disposed continuously between upper and lower devices. Portions of the dielectric separator may be selectively removed to enable connections between stacked FET devices.

At block 3140, the method successively deposits WFM for each of a succession of upper FET devices. Each round of WFM depositions deposits a different WFM upon the target upper FETs of that round of deposition. Deposition of differing WFM upon the nanosheet channels of sets of upper FETs yields sets of upper FETs having differing threshold voltages enabling circuits exploiting the multiple threshold voltages of the respective sets of upper FETs.

At block 3150, fabrication of device BEOL elements including upper FET gate connections and upper FET gate and S/D region contacts occurs. Such contacts fill vias formed through inter-layer dielectric layers.

At block 3160, the method inverts the wafer and forms the bottom FET HKMG structures. At block 3170 the method forms differing WFM for different bottom FETs. Differing gate contact configurations including independent gate contacts for upper and lower FETs, common gate contacts for stacked upper and lower FETs, common gate contacts for adjacent upper or lower FETs, and connects WFM contacts for stacked upper and lower FETs enable fabrication of device logic and control circuits.

At block 3180 the method forms the S/D and gate contacts for the bottom FETs of the CFETs. Metal contacts fill vias formed in interlayer dielectric layers encapsulating the bottom FET devices.

The flowchart and block diagrams in the figures illustrate the architecture, functionality, and operation of possible implementations of systems, methods, and device fabrication steps according to various embodiments of the present invention. In this regard, each block in the flowchart or block diagrams may represent a module, segment, or portion of instructions, which comprises one or more fabrication steps for manufacturing the specified device(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A CFET (complementary field effect transistor) structure comprising:
   a substrate;
   a first CFET formed above the substrate; and
   a second CFET formed above the substrate;
   wherein:
   the first CFET comprises a top FET and a bottom FET, each of the top FET and bottom FET comprises at least one nanosheet channel, the top FET and bottom FET separated by a dielectric layer;
   a gate affiliated with the first CFET and the second CFET devices comprising a continuous horizontal dielectric over the entire length of the gate;
   the top FET of each stacked FET comprises a first polarity;
   the bottom FET of each stacked FET comprises a second polarity;
   the top FET of the first CFET comprises a first work function metal; and
   the top FET of the second CFET comprises a second work function metal.

2. The CFET structure according to claim 1, further comprising independent gate contacts for the top FET of the first CFET and the bottom FET of the first CFET.

3. The CFET structure according to claim 1, further comprising a common gate contact for a top FET of a third CFET and a bottom FET of the third CFET.

4. The CFET structure according to claim 1, further comprising a metal contact connecting the bottom FET of the first CFET and the bottom FET of the second CFET.

5. The CFET structure according to claim 1, wherein the continuous horizontal dielectric comprises a composite dielectric.

6. The CFET structure according to claim 1, further comprising a third work function metal of a bottom FET of a third CFET, the third work function metal in contact with a fourth work function metal of a top FET of the third CFET.

7. The CFET structure according to claim 1, wherein the bottom FET of the first CFET comprises a third work function metal and the bottom FET of the second CFET comprises a fourth work function metal.

8. A CFET (complementary field effect transistor) structure comprising:
   a substrate;
   a first CFET formed above the substrate;
   a second CFET formed above the substrate;
   a third CFET formed above the substrate; and
   a fourth CFET formed above the substrate;
   wherein:
      the first CFET comprises a top FET and a bottom FET, each of the top FET and bottom FET comprising at least one nanosheet channel;
      a gate affiliated with the first CFET and the second CFET devices comprising a continuous horizontal dielectric over the entire length of the gate;
      the top FET of each stacked FET comprises a first polarity;
      the bottom FET of each stacked FET comprises a second polarity;
      the top FET of the first CFET comprises a first work function metal;
      the top FET of the second CFET comprises a second work function metal;
      the top FET of the third CFET comprises a third work function metal; and
      the top FET of the fourth CFET comprises a fourth work function metal.

9. The CFET structure according to claim 8, further comprising independent gate contacts for the top FET of the first CFET and the bottom FET of the first CFET.

10. The CFET structure according to claim 8, further comprising a common gate contact for the top FET of the first CFET and the bottom FET of the first CFET.

11. The CFET structure according to claim 8, further comprising a metal contact connecting the bottom FET of the first CFET and the bottom FET of the second CFET.

12. The CFET structure according to claim 8, wherein the continuous horizontal dielectric comprises a composite dielectric.

13. The CFET structure according to claim 8, further comprising a fifth work function metal of the bottom FET of the third CFET, the third work function metal in contact with the third work function metal.

14. The CFET structure according to claim 8, wherein the bottom FET of the first CFET comprises a sixth work function metal and the bottom FET of the second CFET comprises a seventh work function metal.

* * * * *